United States Patent
Shendon et al.

(10) Patent No.: US 6,513,848 B1
(45) Date of Patent: Feb. 4, 2003

(54) HYDRAULICALLY ACTUATED WAFER CLAMP

(75) Inventors: Norman Shendon, San Carlos, CA (US); John Hearne, Los Altos, CA (US); Bryan Von Lossberg, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/398,744

(22) Filed: Sep. 17, 1999

(51) Int. Cl.$^7$ ................................................ B25J 15/08

(52) U.S. Cl. ................... 294/88; 294/99.1; 294/103.1; 294/119.3; 294/902; 414/941; 901/37; 901/39

(58) Field of Search .......................... 294/1.1, 34, 86.4, 294/87.1, 88, 99.1, 100, 103.1, 104, 119.1, 119.3, 902; 414/416, 941; 901/36, 37, 39

(56) References Cited

U.S. PATENT DOCUMENTS

| | | | |
|---|---|---|---|
| 4,473,455 A | | 9/1984 | Dean et al. .................. 204/298 |
| 4,516,318 A | | 5/1985 | Kirschenman ................ 29/846 |
| 4,586,743 A | | 5/1986 | Edwards et al. ............ 294/86.4 |
| 4,705,951 A | | 11/1987 | Layman et al. .......... 250/442.1 |
| 4,733,632 A | | 3/1988 | Ohmi et al. ................. 118/729 |
| 4,806,057 A | * | 2/1989 | Cay et al. ............. 294/103.1 X |
| 4,813,732 A | | 3/1989 | Klem ....................... 294/103.1 |
| 4,872,803 A | * | 10/1989 | Asakawa ................ 294/99.1 X |
| 4,900,214 A | * | 2/1990 | Ben ...................... 294/103.1 X |
| 4,944,650 A | * | 7/1990 | Matsumoto .............. 414/941 X |
| 5,022,695 A | | 6/1991 | Ayers .......................... 294/88 |
| 5,046,909 A | | 9/1991 | Murdoch ..................... 414/225 |
| 5,133,635 A | | 7/1992 | Malin et al. ............. 414/744.8 |
| 5,180,276 A | | 1/1993 | Hendrickson ................ 414/752 |
| 5,280,983 A | | 1/1994 | Maydan et al. .......... 294/119.1 |
| 5,324,155 A | | 6/1994 | Goodwin et al. ............ 414/225 |
| 5,374,147 A | | 12/1994 | Hiroki et al. ................ 414/217 |
| 5,429,733 A | | 7/1995 | Ishida ..................... 204/224 R |
| 5,447,409 A | | 9/1995 | Grunes et al. ........... 414/744.6 |

(List continued on next page.)

FOREIGN PATENT DOCUMENTS

| EP | 0 445 651 A2 | 2/1991 | ............ H01L/21/00 |
|---|---|---|---|
| EP | 0 423 608 A1 | 4/1991 | .............. B25J/9/12 |
| EP | 0 793 262 A2 | 9/1997 | ............ H01L/21/00 |

OTHER PUBLICATIONS

US 6,227,585, 5/2001, Govzman et al. (withdrawn)*
Sundar, Satish, "Improved Throughput Using Time–Optimal Motion Planning and Design", No date.

*Primary Examiner*—Johnny D. Cherry
(74) *Attorney, Agent, or Firm*—Moser, Patterson, & Sheridan, LLP.

(57) ABSTRACT

The present invention is directed to a wafer clamping mechanism responsive to fluid pressure to retain wafers on a surface with minimal clamping force. The clamping mechanism houses simple operative elements within a housing proximate the wafer and can utilize existing fluid pressure sources to energize the clamping mechanism. In a first embodiment, the clamping mechanism includes a piston and cylinder to urge a clamping arm against the wafer in response to fluid pressure. In a second embodiment, the clamping mechanism includes a bellows arrangement for urging the clamping finger against the wafer in response to a fluid pressure source. In a third embodiment, the clamping mechanism includes a bladder arrangement wherein a bladder is expanded using fluid pressure to urge the clamping arm against the wafer in response to a fluid pressure source. In a fourth embodiment, the clamping mechanism includes a flexure member attached to a dual bellows arrangement for urging the flexure member against the wafer in response to a vacuum pressure source. In a fifth embodiment, the clamping mechanism includes a bent flexure member attached to a dual bellows arrangement with an internal piston and cylinder for urging the flexure member against the wafer in response to positive pressure source.

7 Claims, 13 Drawing Sheets

U.S. PATENT DOCUMENTS

| | | | |
|---|---|---|---|
| 5,469,035 A | 11/1995 | Lowrance | 318/568.1 |
| 5,520,501 A * | 5/1996 | Kouno et al. | 414/941 X |
| 5,605,866 A | 2/1997 | McClanahan et al. | 437/225 |
| 5,637,200 A | 6/1997 | Tsymberov | 204/298.15 |
| 5,647,626 A | 7/1997 | Chaen et al. | 294/87.1 |
| 5,702,228 A | 12/1997 | Tamai et al. | 414/744.5 |
| 5,711,646 A | 1/1998 | Ueda et al. | 414/225 |
| 5,720,590 A | 2/1998 | Hofmeister | 414/744.2 |
| 5,733,096 A | 3/1998 | Van Doren et al. | 414/744.3 |
| 5,804,089 A | 9/1998 | Suzuki et al. | 216/71 |
| 5,838,121 A | 11/1998 | Fairbairn et al. | 318/45 |
| 5,955,858 A | 9/1999 | Kroeker et al. | 318/568.11 |
| 5,980,187 A * | 11/1999 | Verhovsky | 294/103.1 X |
| 6,116,848 A * | 9/2000 | Thomas et al. | 414/941 X |
| 6,155,773 A | 12/2000 | Ebbing et al. | 414/744.5 |
| 6,222,337 B1 | 4/2001 | Kroeker et al. | 318/568.11 |
| 6,256,555 B1 | 7/2001 | Bacchi et al. | 700/245 |

* cited by examiner

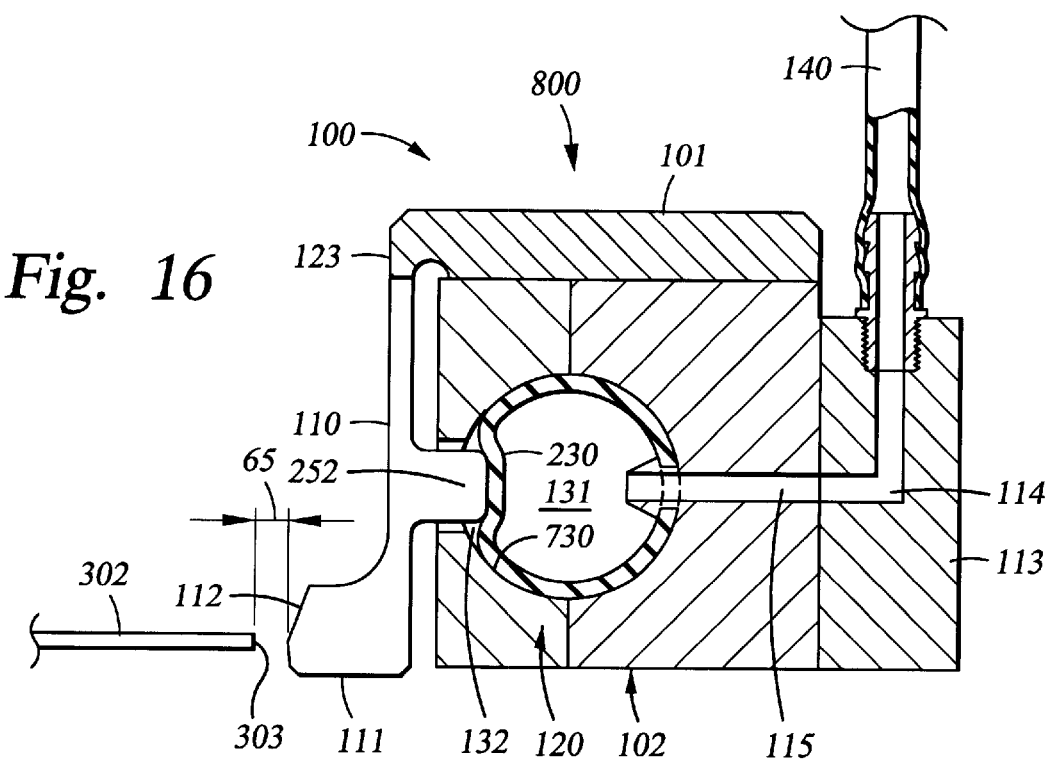
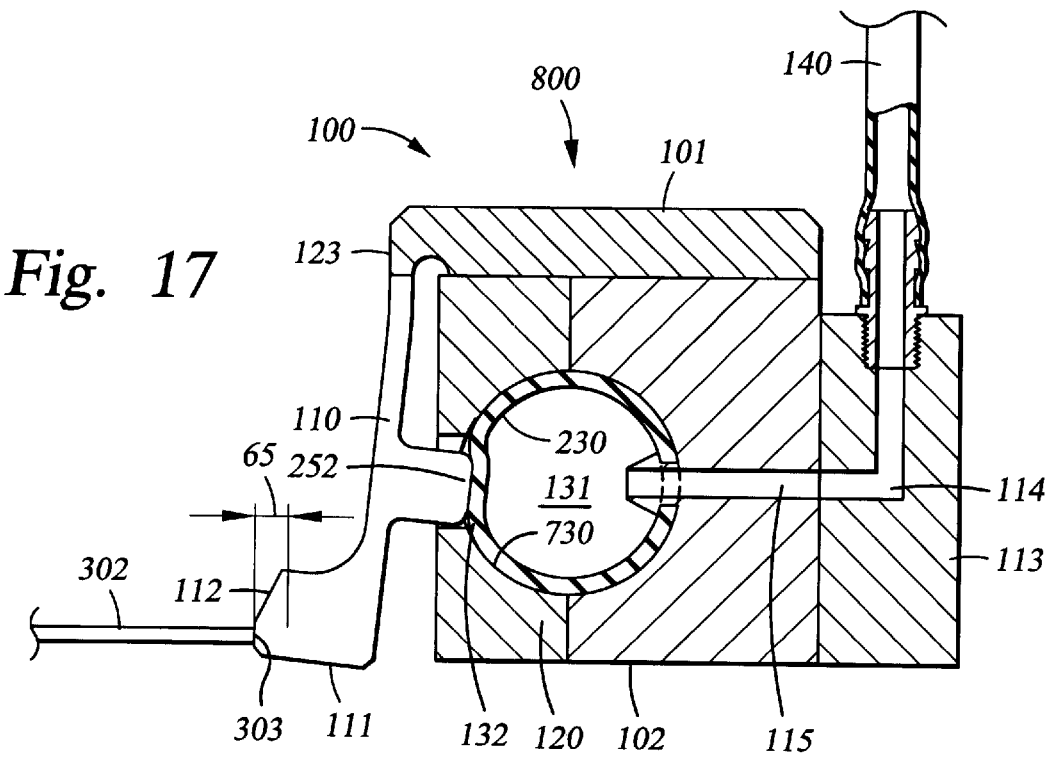

HYDRAULICALLY ACTUATED WAFER CLAMP

BACKGROUND OF THE INVENTION

1. Field of the Invention

The present invention relates generally to a workpiece handling device, and more particularly, to a hydraulically or pneumatically operated mechanical wafer clamp for securing a substrate to a substrate handling device in a processing system.

2. Background of the Invention

Modern semiconductor processing systems include cluster tools which integrate a number of process chambers together in order to perform several sequential processing steps without removing the substrate from a highly controlled processing environment. These chambers may include, for example, degas chambers, substrate preconditioning chambers, cooldown chambers, transfer chambers, chemical vapor deposition chambers, physical vapor deposition chambers and etch chambers. The combination of chambers in a cluster tool, as well as the operating conditions and parameters under which those chambers are run, are selected to fabricate specific structures using a specific process recipe and process flow.

Once the cluster tool has been set up with a desired set of chambers and auxiliary equipment for performing certain process steps, the cluster tool will typically process a large number of substrates by continuously passing them through a series of chambers and process steps. The process recipes and sequences will typically be programmed into a microprocessor controller that will direct, control and monitor the processing of each substrate through the cluster tool. Once an entire cassette of wafers has been successfully processed through the cluster tool, the cassette may be moved to another cluster tool or stand alone tool, such as a chemical mechanical polisher, for further processing.

Typical cluster tools process one substrate at a time by passing the substrate through a series of process chambers that are each designed to process a single substrate at a time. However, more recent designs have incorporated a parallel processing structure whereby two substrates are processed at a time. In these dual systems, the robot has a pair of spaced parallel blades that pass the wafers through a series of parallel processing chambers. Each of the processing chambers is constructed to accommodate and process two wafers at a time. In this way, throughput of substrates in the cluster tool is effectively doubled. On exemplary fabrication system is the cluster tool shown in U.S. patent application Ser. No. 08/752,471, entitled "Dual Blade Robot," filed on Nov. 18, 1996, now U.S. Pat. No. 5,838,121 and which is incorporated herein by reference.

Substrate throughput in a cluster tool can be improved by increasing the speed of the wafer handling robot positioned in the transfer chamber. As the robot speed and acceleration increase, the amount of time spent handling each substrate and delivering each substrate to its next destination is decreased. However, the desire for speed must be balanced against the possibility of damaging the substrate or the films formed thereon. If a robot moves a substrate too abruptly, or rotates the wafer blade too fast, then the wafer may slide off the blade, potentially damaging the wafer, the chamber and/or the robot. Further, sliding movements of the substrate on the wafer blade may create contaminants, which if received on a substrate, can contaminate the substrate and the devices formed thereon. In addition, movement of the substrate on the wafer blade may cause substantial misalignment of the substrate that may result in inaccurate processing or even additional particle generation when the substrate is later aligned on the support member in the chamber.

Conventional robot designs rely on frictional forces that are present between the bottom surface of a wafer and the top surface of the wafer blade to prevent slippage of the wafer. The robot blade typically includes a wafer bridge on the distal end of the wafer blade and on the base of the blade to confine the wafer between the two ends of the blade. However, the wafer bridge at both the base and the distal end do not extend around the sides of the blade, and therefore, do very little to prevent the wafer from slipping laterally on the blade. Furthermore, the wafers are not always perfectly positioned against the bridge and movement or high rotational speeds may throw the wafer against one of the bridges and cause damage to the wafer or cause the wafer to slip over the bridge and/or off the blade. The total resistance due to friction is easily exceeded by the inertia of the wafer during rapid rotation or extension of the robot. However, this low coefficient of friction is typically relied upon when determining the speed at which a robot rotates.

patent application Ser. No. 08/801,076, entitled "Mechanically Clamping Robot Wrist," filed on Feb. 14, 1997, now U.S. Pat. No. 5,955,858 which is hereby incorporated by reference, further discusses the problem of wafer slippage on a robot blade and provides a mechanical clamping device to secure a wafer to the blade. The mechanical device relies on springs or flexure assemblies to clamp a wafer on a blade and is actuated by relative movement between the arms forming the linkage of the robot. While this is one solution, the design requires a relatively complex assembly to achieve clamping of a wafer.

Therefore, there is a need for a workpiece handling device which utilizes a simple and cost-effective wafer handling clamp to secure wafers during movement in a processing system.

SUMMARY OF THE INVENTION

The present invention is generally directed to a wafer clamping mechanism for retaining a wafer on a wafer handling robot. In one aspect, the wafer clamping mechanism comprises an actuation assembly mounted to the wafer handling robot proximate the wafer seat and a remote fluid source coupled to the actuation assembly through a fluid conduit for engaging the actuation assembly. The actuation assembly is adapted to engage a wafer with radial clamping forces on at least a portion of the edge of the wafer.

In one aspect, the clamping mechanism may be a fluid cylinder clamping mechanism, which itself further comprises: a fluid cylinder within a housing of the actuation assembly in fluid communication with the source of fluid pressure; a piston disposed within and adapted to reciprocate within the fluid cylinder in response to fluid pressure within the fluid cylinder; a piston rod affixed to and extending from the piston in a direction generally towards the wafer; and a clamping arm affixed to the housing and normally biased generally away from the wafer. In this aspect, the rod may be adapted to engage the clamping arm and bias the clamping arm towards the wafer to exert radial clamping forces on the wafer upon reciprocation of the piston. The wafer is retained with a clamping force sufficient to retain the wafer but insufficient to deform the wafer.

In another aspect, the clamping mechanism may be a bladder clamping mechanism comprising a chamber formed in the housing body of the actuation assembly; a bladder disposed within the chamber and in fluid communication with the source of fluid pressure; and a clamping arm affixed to the housing body and normally biased generally away from the wafer. In this aspect, the bladder is adapted to engage the clamping arm and to bias the clamping arm towards the wafer to exert radial clamping forces when the bladder is expanded or inflated in response to fluid pressure. The wafer is retained with a clamping force sufficient to retain the wafer but insufficient to deform the wafer.

In yet another aspect, the clamping mechanism may be a bellows clamping mechanism which comprises a chamber within a housing body of the actuation assembly; a clamping arm affixed to the housing and normally biased generally away from the wafer; and a bellows disposed in and affixed to the housing body chamber and having a front volume in fluid communication with the source of fluid pressure. In this aspect, the bellows has a piston affixed to an end of the bellows generally towards the clamping arm. The bellows piston is adapted to reciprocate within the housing chamber in response to fluid pressure within the front volume within the bellows and to engage the clamping arm and to bias the clamping arm towards the wafer to exert radial clamping forces on the wafer upon reciprocation of the bellows piston. The wafer is retained with a clamping force sufficient to retain the wafer but insufficient to deform the wafer.

In still another aspect, the clamping mechanism comprises a dual bellows leaf spring clamping mechanism having a manifold having a fluid passageway therein; a first bellows affixed to the manifold and having a bellows chamber in fluid communication with the manifold passageway; a second bellows affixed to the manifold and having a bellows chamber in fluid communication with the manifold passageway; and a flexure member attached to one or more bellows actuation plates affixed to opposing ends of the first and second bellows. In this aspect, the flexure member forms an arc in a direction generally towards the wafer. The flexure member is also normally biased outward to extend the first and second bellows away from the manifold so that an apogee portion of the flexure member is withdrawn away from the wafer. The bellows actuation plates are further adapted to retract towards the housing in response to fluid pressure provided in the housing to extend the apogee portion of the flexure member in a direction generally towards the wafer to exert radial clamping forces on the wafer. In this aspect, the source of fluid pressure may be a vacuum pressure source and the flexure member may be a leaf spring.

In another aspect, the invention provides a method of retaining and releasing a wafer on a wafer handling robot. The method comprises the steps of providing a clamping mechanism proximate an outer edge of the wafer responsive to fluid pressure; providing fluid pressure to the clamping mechanism so that a clamping arm extends towards the edge of the wafer to be retained; and releasing the wafer by removing fluid pressure from the clamping mechanism so that the clamping arm retracts from the edge of the wafer. In this aspect of the invention, the wafer is retained with a clamping force sufficient to retain the wafer but insufficient to deform the wafer.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 16 is a cross-sectional view of a third embodiment of a clamping device to in accordance with the present invention shown in a neutral, released position.

FIG. 17 is a cross-sectional view of a third embodiment of a clamping device in accordance with the present invention shown in an engaged, or retaining position.

DETAILED DESCRIPTION OF THE PREFERRED EMBODIMENT

Figure 1:
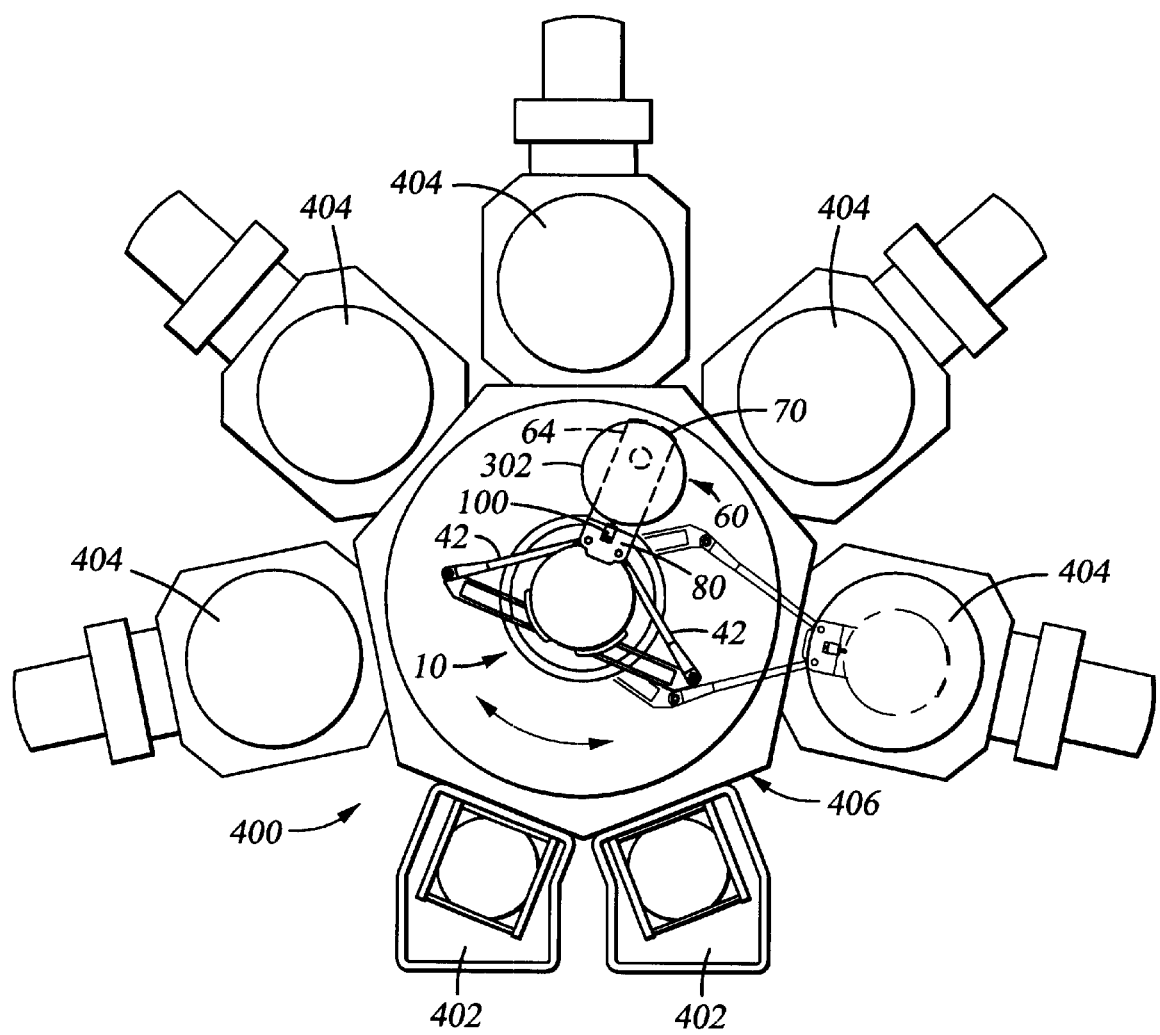
FIG. 1 is a schematic diagram of a first integrated cluster tool incorporating an embodiment of the wafer clamping mechanism of the present invention on a single-blade "frog-leg type" robot.
Figure 2:
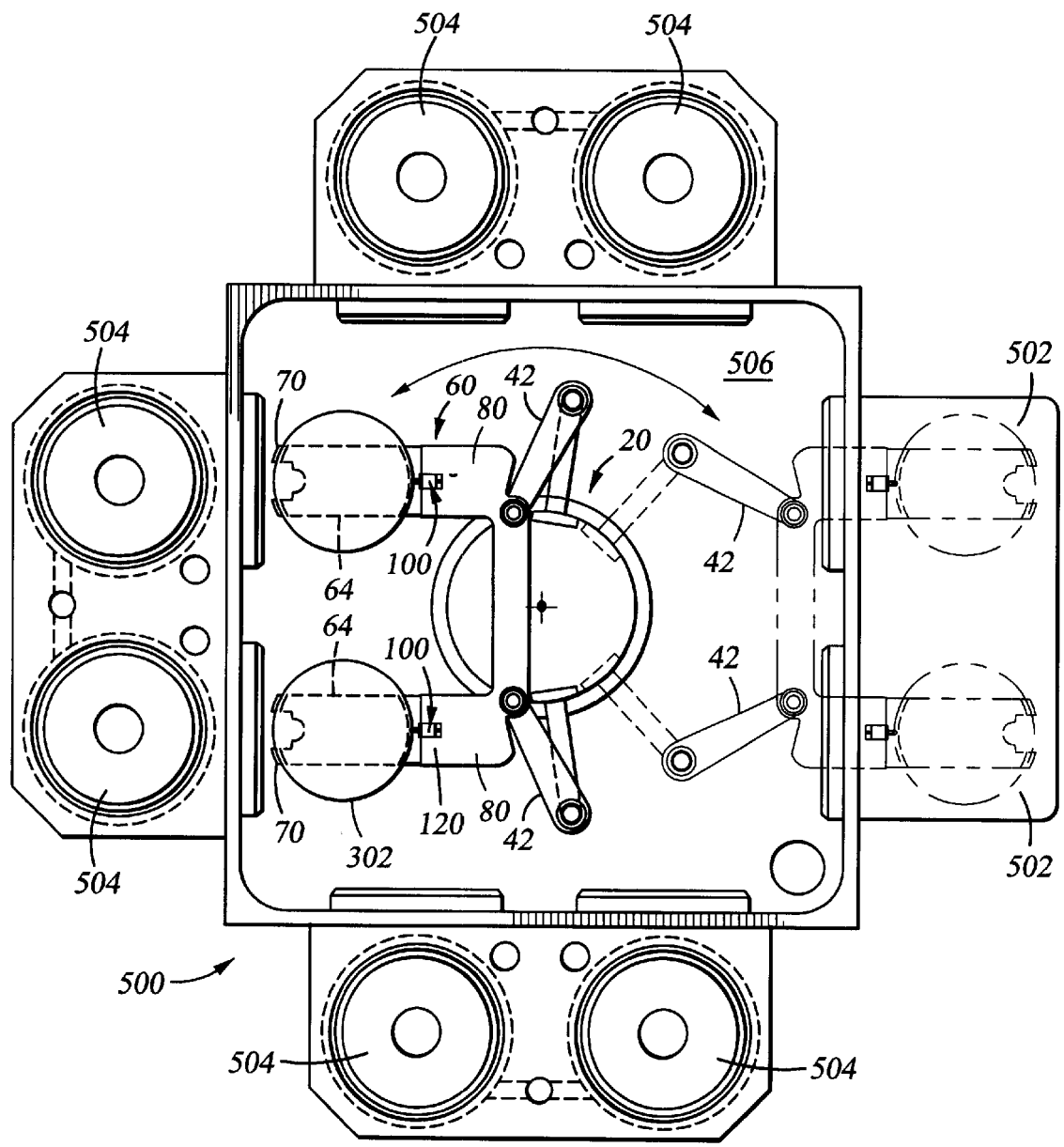
FIG. 2 is a schematic diagram of a second integrated cluster tool incorporating an embodiment of the wafer clamping mechanism of the present invention on a dual-blade "frog-leg type" robot.
Figure 3:
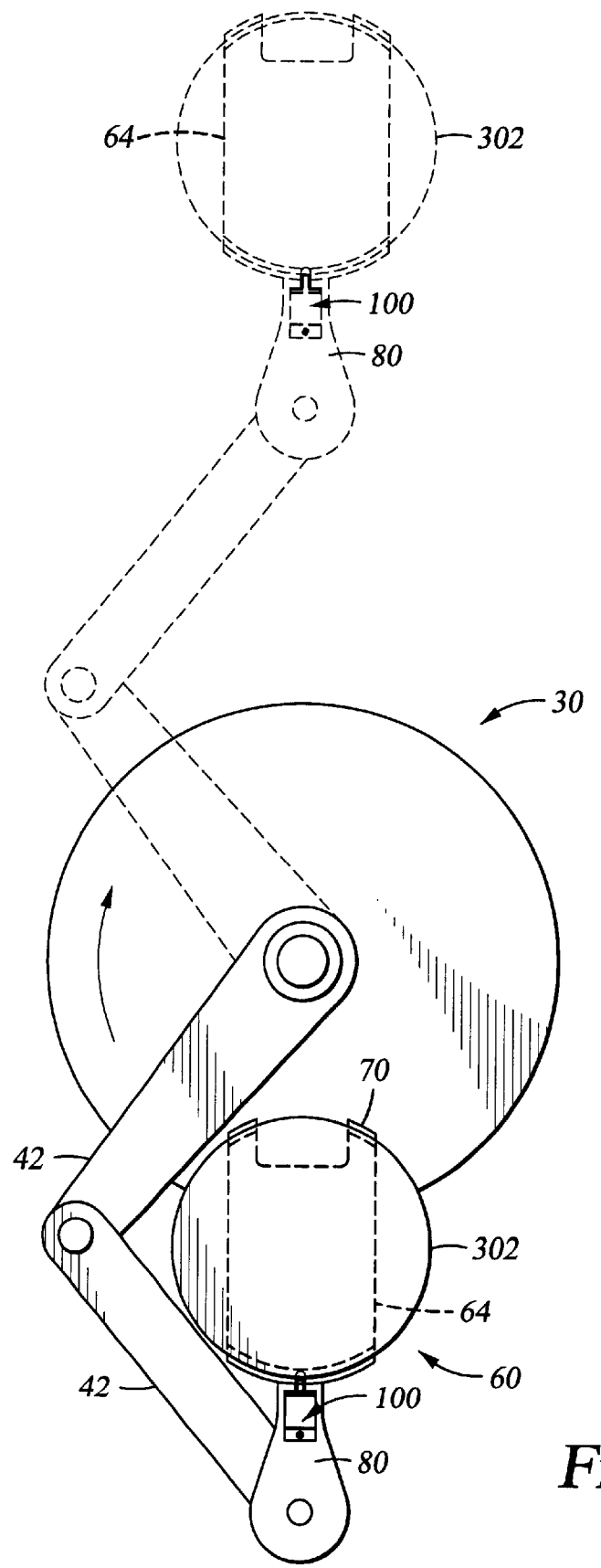
FIG. 3 is a schematic diagram of a third embodiment of the wafer clamping mechanism of the present invention on a polar robot.

The present invention generally provides an improved wafer clamping mechanism for retaining a wafer on the blade of a wafer handling robot in a vacuum processing system as shown generally in FIGS. 1–3. More particularly, the present invention comprises a robot clamp wrist 80 for mechanically clamping a wafer 302 (or other workpiece) to a wafer handling member 60 mounted on robot arms 42. Referring to FIG. 2, the present invention may also comprise a dual-wafer robot clamp wrist 80 for mechanically clamping a pair of wafers 302 (or other workpieces) to a pair of wafer handling members 60 mounted on robot arms 42. The clamping wrist selectively applies sufficient force to prevent wafer slippage and wafer damage during rapid rotation and linear movement of the blade 64 while allowing transfer of the wafer 302 to be accomplished following extension. The clamping wrist biases the wafer 302 on the blade 64 against a retaining member 70 during a specified range of arm extension and/or retraction.

In the embodiments shown in FIGS. 1–3, the clamping wrist uses a single clamping mechanism for each blade to position and hold the wafer 302 with minimal particle generation and wafer damage. However, as described further below, two or more clamping mechanisms may be used in connection with each blade 64 to more securely position and hold the wafer 302 on the blade 64. The clamping mechanism is designed so that wafers 302 are normally clamped except when the wafer blade 64 is near full extension while delivering or picking up a wafer 302. However, because the chambers may be positioned at different distances from the axis of the robot (10, 20, 30, respectively, as shown in FIGS. 1–3), the clamp is designed to release the wafer 302 in a predetermined range of extension to accommodate any discrepancy in delivery distance.

FIG. 1 shows a schematic diagram of an exemplary integrated cluster tool 400 useful for processing wafers 302. Wafers 302 are introduced into and withdrawn from the cluster tool 400 through a loadlock chamber 402, typically an integral part of tool 400. A "frog-leg type" robot 10 having a single wafer handling blade 64 is located within the cluster tool 400 to transfer the substrates between the loadlock chamber 402 and the various process chambers 404. The robot arms 42 are illustrated in the retracted position for rotating freely within the transfer chamber 406 and are also illustrated in phantom in the extended position for retrieving or delivering the wafers within a particular process chamber 404. The specific configuration of the cluster tool in FIG. 1 is merely illustrative and the system shown is capable of processing a single wafer 302 at a time. However, the invention is equally applicable to other robot assemblies. In a preferred aspect of the invention, a microprocessor controller is provided to control the fabricating process sequence, conditions within the cluster tool, and operation of the robot 10.

FIG. 2 shows a schematic diagram of another exemplary integrated cluster tool 500 useful for processing wafers 302 in tandem. Wafers 302 are introduced into and withdrawn from the cluster tool 500 through a loadlock chamber 502, typically an integral part of tool 500. A dual-blade "frog-leg type" robot 20 having a pair of wafer handling blades 64 is located within the cluster tool 500 to transfer the substrates between the loadlock chamber 502 and the various process chambers 504. The robot arms 42 are illustrated in the retracted position for rotating freely within the transfer chamber 506 and are also illustrated in phantom in the extended position for retrieving or delivering the wafers within a particular chamber, such as loadlock chamber 502. The specific configuration of the cluster tool in FIG. 2 is merely illustrative and the system shown is capable of processing two wafers 302 at a time. However, the invention is equally applicable to other robot assemblies. In a preferred aspect of the invention, a microprocessor controller is provided to control the fabricating process sequence, conditions within the cluster tool, and operation of the robot 20.

FIG. 3 shows a "polar type" robot 30 having a single wafer handling blade 64 to transfer the substrates between a loadlock chamber and the various process chambers. The robot arms 42 are illustrated in the retracted position for rotating freely within the transfer chamber 406 and are also illustrated in phantom in an extended position for retrieving or delivering a wafer within a particular process chamber 404. The specific configuration of the cluster tool in FIG. 1 is merely illustrative and the system shown is capable of processing a single wafer 302 at a time. However, the invention is equally applicable to other robot assemblies having, for example, a dual-blade robot clamp wrist. In a preferred aspect of the invention, a microprocessor controller is provided to control the fabricating process sequence, conditions within the cluster tool, and operation of the robot 30.

Now with reference to FIGS. 1–3, each of the robots 10, 20, 30 include at least one pneumatically actuated wafer clamping mechanism 100 mounted on or otherwise associated with clamp wrist 80. The wafer clamping mechanism 100 is actuated using existing power source lines. Existing vacuum pressure lines, positive pressure lines, or hydraulic pressure lines may be used or separate fluid pressure lines may be provided to actuate the wafer clamping mechanism 100. When actuated, wafer clamping mechanism 100 either retains or releases the wafer 302 on the wafer blade 64, depending on the particular design utilized as described further below.

Wafer blade 64 includes a retaining member 70, which may be a unitary bridge or individual retaining members 70 (as shown) extending upwardly from the distal end of the wafer blade 64 opposite the clamp wrist 80, and is adapted to abut a wafer 302 disposed on the blade 64. Wafer clamping mechanism 100 generally retains the wafer 302 on wafer blade 64 by urging the wafer 302 located at the end of the wafer blade 64 proximate the clamp wrist 80 towards and against retaining member 70. While the wafer is in the retracted position, the wafer clamping mechanism 100 is either actuated or do-actuated (again, depending on the particular embodiment employed) to engage the mechanism 100 to securely retain the wafer 302 on the wafer blade 64. While the wafer arm is in the fully extended position (shown in phantom), the wafer clamping mechanism 100 is either actuated or de-actuated (again, depending on the particular embodiment employed) to disengage the mechanism 100 to permit the wafer 302 to rest freely on the wafer blade 64 so that it may be removed by conventional methods.

Figure 4:
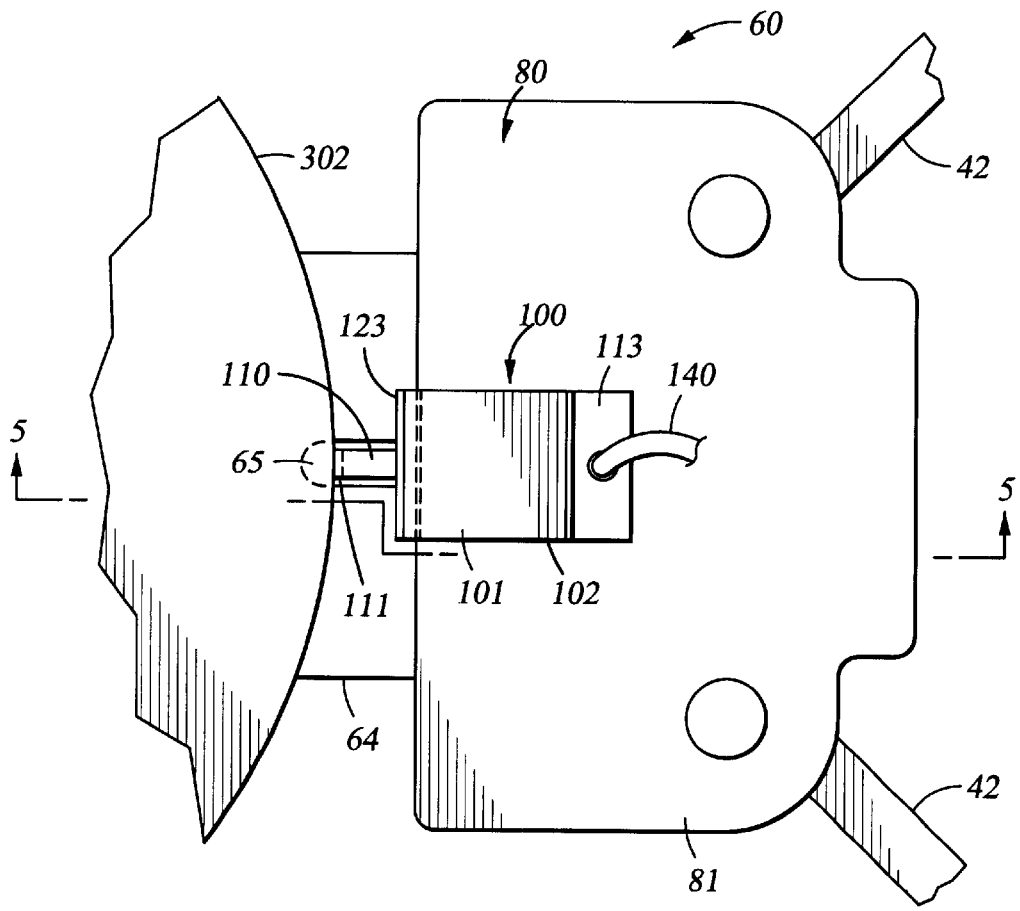
FIG. 4 is a partial top view of a workpiece handling member shown in the retracted, engaged, position in connection with the "frog-leg type" robot of FIG. 1.

FIG. 4 shows a partial top view of workpiece handling member 60 shown in connection with the "frog-leg type" robot having a single wafer handling blade 64. The robot and robot arms 42 are shown in the retracted position for rotation of the robot. Wafer clamping mechanism 100 is shown mounted on clamp wrist 80 in an engaged position, thus securing the wafer 302 against retaining member 70 (shown in FIG. 1). Although not shown, it will be obvious to one of ordinary skill in the art that wafer clamping mechanism 100 may be similarly mounted to the dual-blade "frog-leg type" robot 20 proximate each of the pair of wafer handling blades 64 of robot 20 (shown in FIG. 2).

Figure 5:
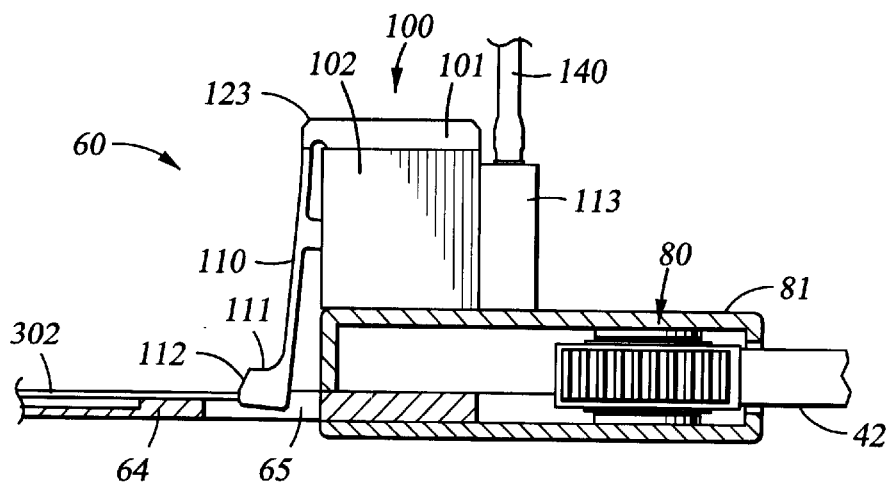
FIG. 5 is a partial cross-sectional view of the workpiece handling member of FIG. 4 taken along line 5—5.

FIG. 5 shows a partial cross-sectional view of workpiece handling member 60 taken along line 5—5 of FIG. 4 in the engaged position. FIG. 5 shows wrist housing 80 with housing cover plate 81, which receives and partially contains robot arms 42. Wafer clamping mechanism 100 is shown mounted on wrist housing 80. Wafer clamping mechanism 100 includes a clamping arm mounting plate 101 mounted to or integral with the top of body 102 of the mechanism 100. Clamping arm mounting plate 101 preferably includes a hinge portion 123 from which a clamping arm 110 extends downward and slightly away from the body 102 of clamping mechanism 100. Hinge portion 123 may preferably be a flexure member which may yield to permit outward movement of the clamping arm 110 to engage the edge of wafer 302. Alternatively, hinge portion 123 is rigid and clamping arm 110 is a flexure member which may, itself, flex to permit outward movement of clamping finger 111 provided at a distal end of clamping arm 110 proximate the edge of wafer 302. Upon engagement, face 112 of clamping finger 111 contacts the edge of wafer 302 to abut wafer 302 and urge wafer 302 against retaining member 70 (shown in FIG. 1). Clamping arm 110 is shown extending partially within a slot 65 provided in wafer blade 64 so that the face 112 of clamping finger 111 may adequately abut the edge of wafer 302.

Figure 6:
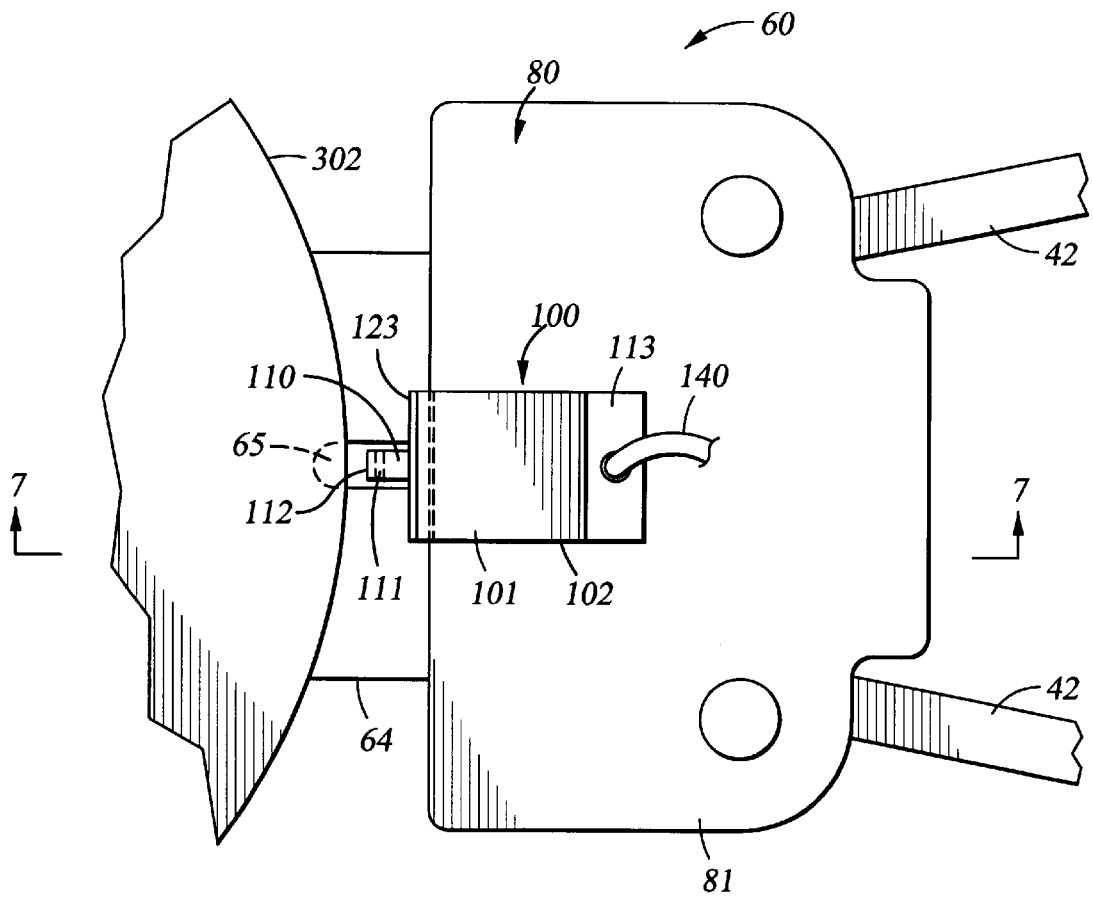
FIG. 6 is partial top view of a workpiece handling member shown in the extended, disengaged, position in connection with the "frog-leg type" robot of FIG. 1.

FIG. 6 shows a partial top view of workpiece handling member 60 shown in connection with the "frog-leg type" robot having a single wafer handling blade 64. Robot 10 and robot arms 42 are shown in the extended position for delivery or receipt of a wafer 302. Wafer clamping mechanism 100 is shown in a disengaged position, thus allowing wafer 302 to rest freely on wafer blade 64 for removal therefrom or placement thereon of a wafer 302.

Figure 7:
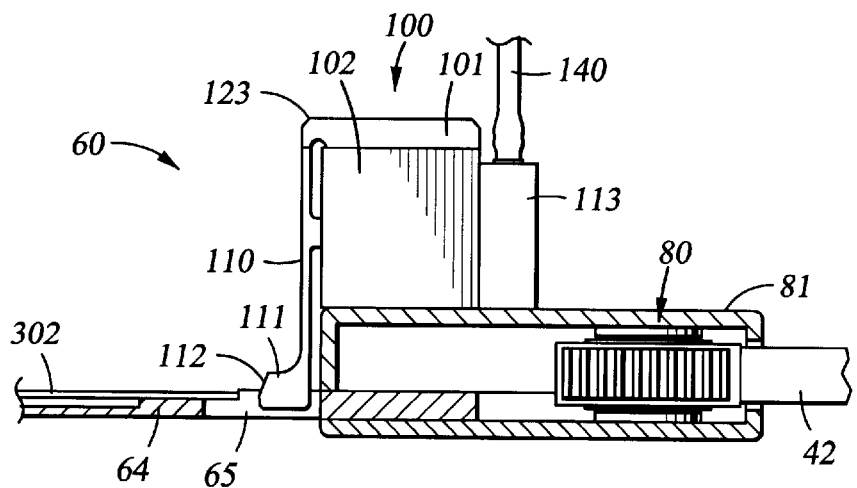
FIG. 7 is a partial cross-sectional view of the workpiece handling member of FIG. 6 taken along line 7—7.

FIG. 7 shows a partial cross-sectional view of workpiece handling member 60 taken along line 7—7 of FIG. 6 in the disengaged position. The hinge portion 123 or clamping arm 110, depending on the embodiment used, has returned clamping arm 110 and clamping finger 111 to the disengaged position away from the wafer 302 within slot 65.

Figure 8:
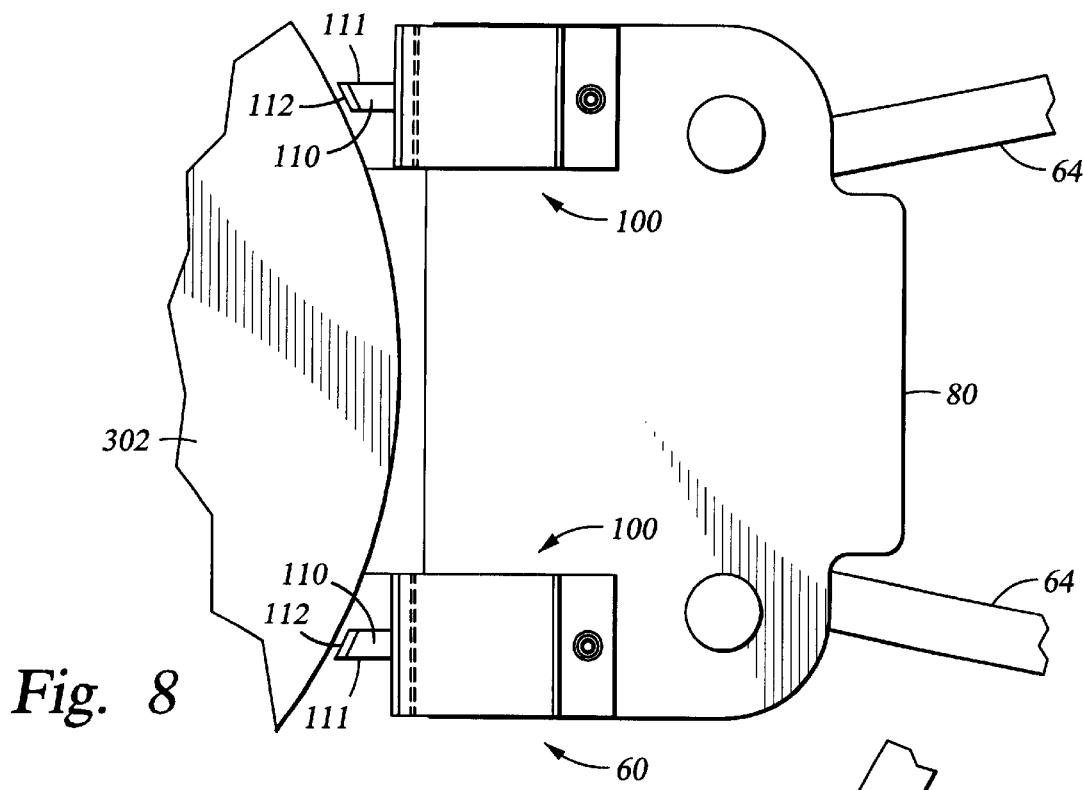
FIG. 8 is a partial top view of a workpiece handling member with a dual-clamping embodiment of the clamping mechanism of the present invention. The workpiece handling member is shown in the extended, disengaged position with the clamping arm and clamping finger withdrawn away from the edge of wafer.
Figure 9:
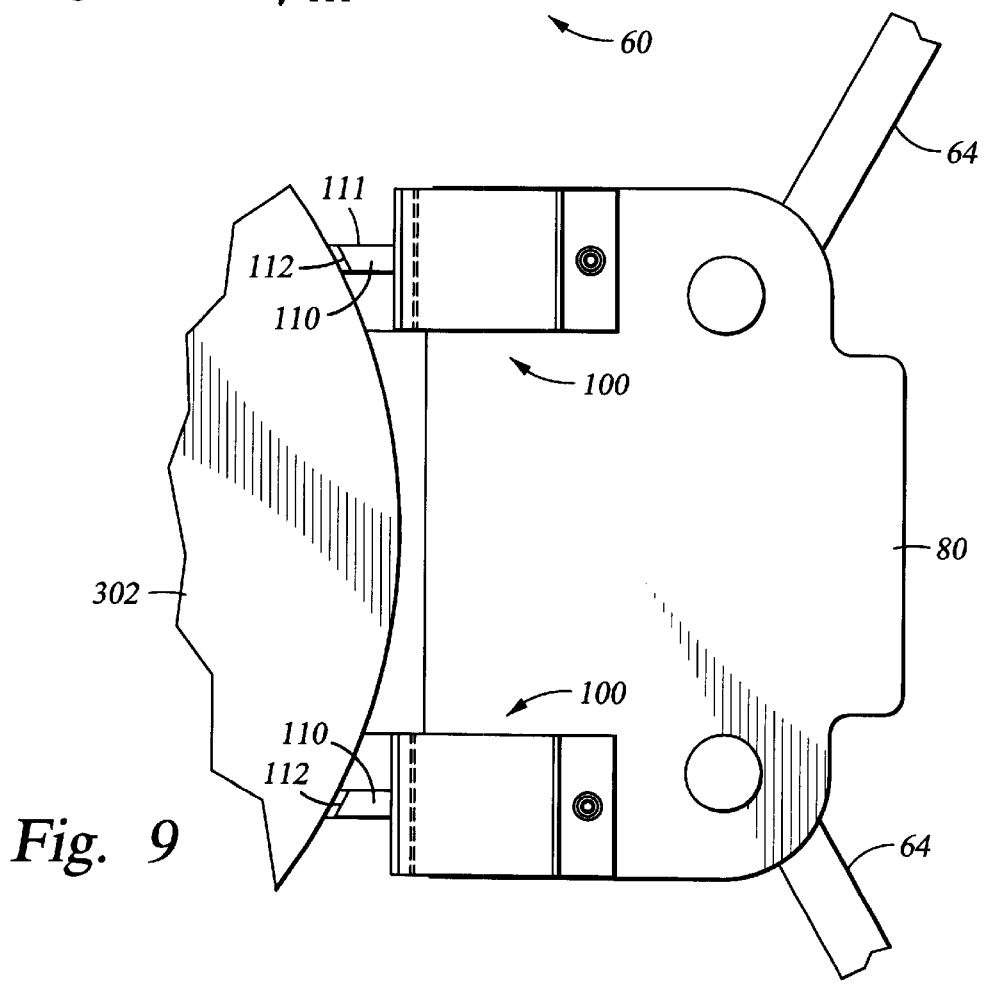
FIG. 9 is a partial top view of a workpiece handling member with a dual-clamping embodiment of the clamping mechanism of the present invention. The workpiece handling member is shown in the retracted, engaged position with the clamping arm and clamping finger extended and urged against the edge of the wafer.

FIG. 8 shows a dual-clamping embodiment of workpiece handling member 60 in which a pair of wafer clamping mechanisms 100 are provided spaced-apart on the clamp wrist 80 to engage and abut wafer 302 at spaced-apart locations along the periphery of wafer 302. FIG. 8 shows the dual-clamping embodiment in the extended, disengaged position with the clamping arm 110 and clamping finger 111 withdrawn away from the edge of wafer 302. As shown, face 112 of clamping finger 111 may preferably have a profile matching the edge of wafer 302 to more securely retain wafer 302. Although not shown, the entire clamping mechanism 100 may be mounted such that the direction of travel of the clamping arm 110 is co-extensive with a line extending radially outward from the center of the wafer 302 to beneficially align the face 112 of clamping finger 111 with the edge of wafer 302. FIG. 9 shows the dual-clamping embodiment of workpiece handling member 60 in the retracted, engaged position with the clamping arm 110 and clamping finger 111 abutting the edge of wafer 302 to retain the wafer 302 against retaining member 70 (shown in FIG. 1).

Figure 10:
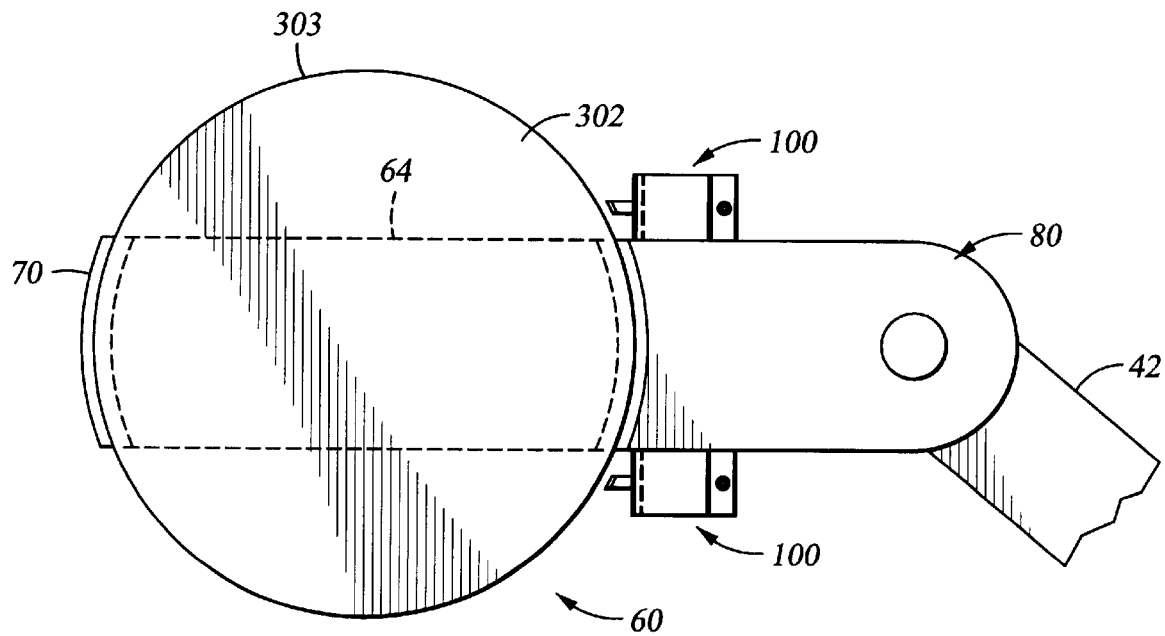
FIG. 10 is a partial top view of a dual-clamping embodiment of the clamping mechanism shown in connection with the "polar type" robot having a single wafer handling blade. The robot and robot arms are shown in the extended position for delivery or retrieval of a wafer on the wafer blade.
Figure 11:
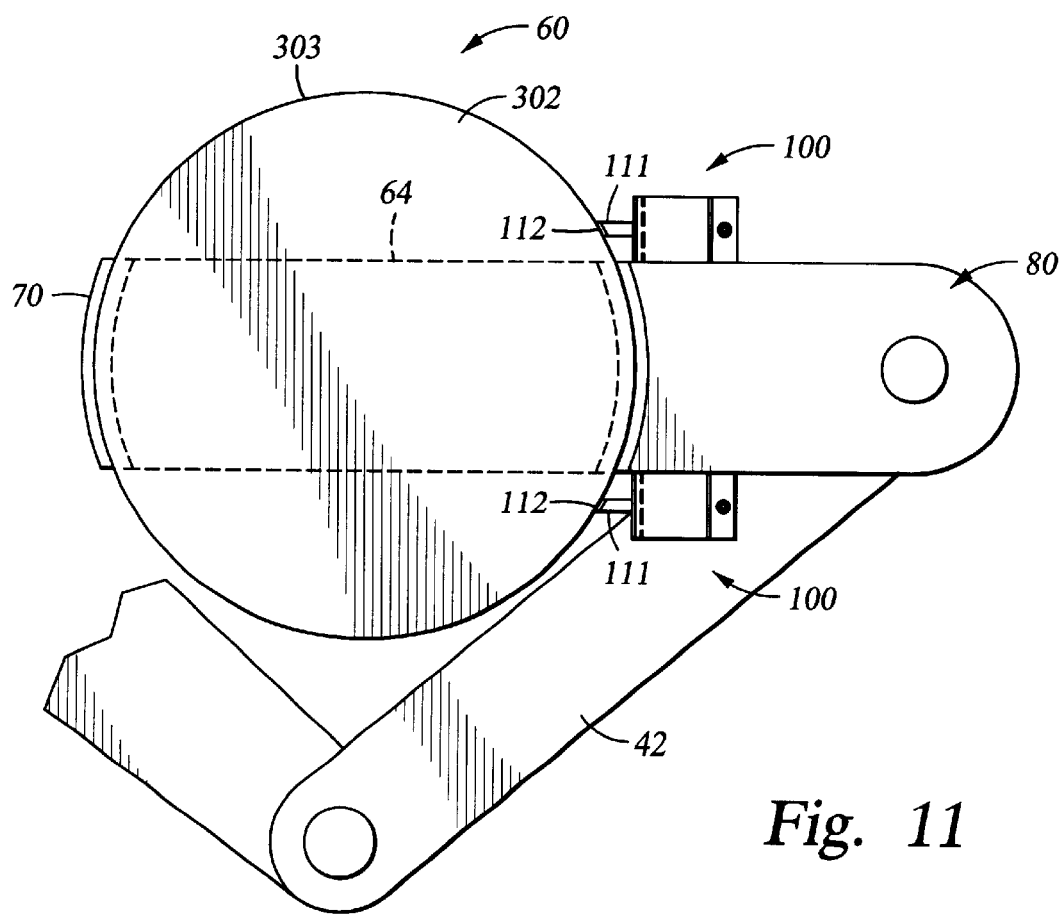
FIG. 11 is a partial top view of a dual-clamping embodiment of the clamping mechanism shown in connection with the "polar type" robot having a single wafer handling blade. The robot and robot arms are shown in the retracted position for rotation of the robot with the wafer clamped securely to the wafer blade.

FIG. 10 shows a partial top view of a dual-clamping embodiment of workpiece handling member 60 shown in connection with the "polar type" robot 30 having a single wafer handling blade 64 (shown in FIG. 3). The robot and robot arms 42 are shown in the extended position. A pair of wafer clamping mechanisms 100 are shown mounted directly to and spaced-apart on clamp wrist 80 in a disengaged position permitting removal of a wafer 302 from or placement of a wafer 302 on wafer blade 64. Wafer clamping mechanisms 100 are shown spaced-apart similar to the embodiment shown in FIGS. 8–9. FIG. 11 shows a partial top view of the dual-clamping embodiment in an engaged position in which the clamping mechanisms firmly secure the wafer 302 to blade 64 as previously described for rotation of the robot 10. Preferably, in each embodiment, the wafer clamping mechanisms 100 are engaged and/or disengaged simultaneously to beneficially secure the wafer 302 on blade 64.

Fluid Cylinder Clamping Embodiment

Figure 12:
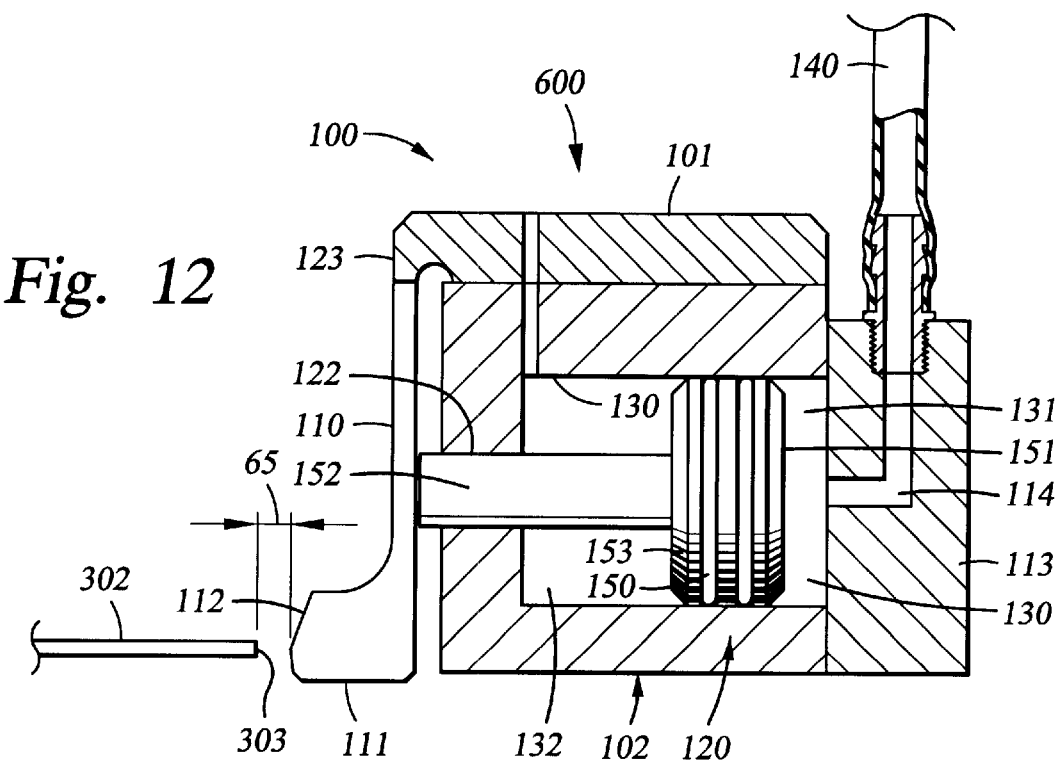
FIG. 12 is a cross-sectional view of a first embodiment of a clamping device in accordance with the present invention shown in a neutral, released position.
Figure 13:
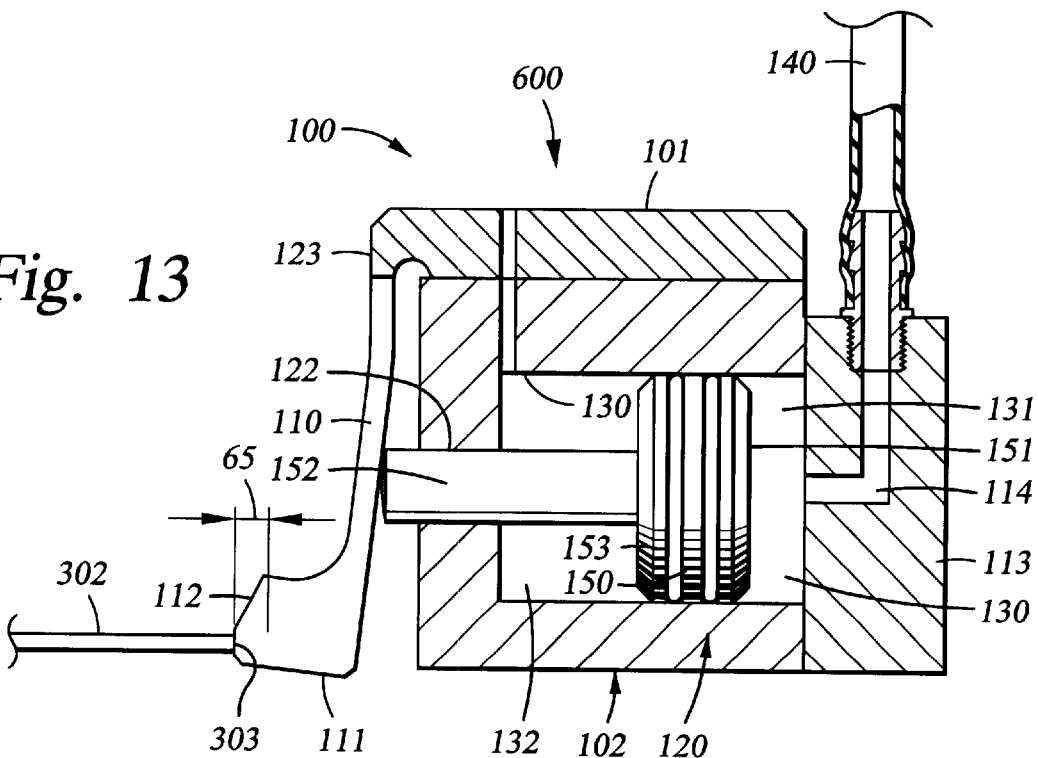
FIG. 13 is a cross-sectional view of a first embodiment of a clamping device in accordance with the present invention shown in an engaged, or retaining position.

Referring to FIGS. 12–13, in accordance with a first embodiment of the clamping mechanism 100 of the present invention, the wafer clamping mechanism 100 is preferably a pneumatic cylinder clamping mechanism 600. The operating mechanisms of pneumatic cylinder clamping mechanism 600 are preferably contained within a housing body 102 without the need of complex linkage mechanisms remote from the mechanism, which would otherwise be exposed to the atmosphere proximate the wafer. Accordingly, particle generation may be minimized to prevent contamination of the wafer through actuation of the wafer clamping mechanism.

Fluid cylinder clamping mechanism 600 includes an actuation assembly 120 for providing actuating forces in response to an increase in fluid pressure provided to cylinder bore 130 by an external fluid pressure source (not shown). Actuation assembly 120 includes cylinder bore 130, defined within the body 102 of actuation assembly 120. Fluid pressure is provided to cylinder bore 130 through control line 140 in fluid communication with both the cylinder bore 130 and the source of fluid pressure (not shown).

Actuation assembly 120 further includes slidable piston 150, slidably disposed within cylinder bore 130. A front volume 131 is defined by the body 102, a front piston face 151 of piston 150, and a front end cap 113 mounted to body 102. A back volume 132 is defined by the body 102 and a back piston face 153 of piston 150. Piston 150 is adapted to be sealingly engaged about the walls of the body 102 and to reciprocate within cylinder bore 130 in response to fluid pressure provided within the front volume 131 of cylinder bore 130. Accordingly, as fluid pressure is increased within the front volume 131 of cylinder bore 130, piston 150 is actuated towards the wafer 302.

Actuation assembly 120 further includes a piston rod 152 connected to a rear face 153 of piston 150. The piston rod 152 extends perpendicularly from the back face 153 outward and through an aperture 122 formed in the body 102. In operation, the piston rod 152 translates the movement of piston 150 to actuate clamping arm 110 and is suitably sized to contact clamping arm 110 during actuation of the fluid cylinder clamping mechanism 600.

Clamping arm 110 preferably extends outwardly and downwardly from an upper portion of housing 102 and has a clamping finger 111 at a distal end of the clamping arm 110 for engagement with the wafer 302 when the clamping arm 110 has been actuated by actuation assembly 120. At a proximal end of the clamping arm 110 is attached a semi-rigid biasing shoulder 123, which in a particular embodiment is an integral component of the clamping arm 110. The shoulder 123 is sufficiently flexible to allow a biasing force on the clamping arm 110 to actuate the clamping arm 110 away from the body 102 and sufficiently rigid to allow the clamping arm 110 to return to a neutral position (shown in FIG. 12) when the actuating force is removed. Fluid cylinder clamping mechanism 600 is shown in FIG. 12 in a neutral, disengaged position in which clamping arm 110 does not contact the edge 303 of wafer 302. Clamping arm 110 is, accordingly, shown in its neutral, disengaged position in which it is biased generally towards the housing body 102 and away from the wafer 302. A clamping distance 65 is provided between the clamping finger 111 and the edge 303 of the wafer 302 in the disengaged position shown in FIG. 12 whereby the clamping finger 111 does not contact the edge 303 of the wafer 302. In the disengaged position, a wafer 302 may be placed on or removed from the blade 64.

FIG. 13 shows fluid cylinder clamping mechanism 600 in its engaged position in which clamping finger 111 is engaged with the edge 303 of wafer 302 to retain wafer 302 on the wafer handling robot. Accordingly, clamping arm 110 and clamping finger 111 have closed clamping distance 65 so that clamping finger 111 contacts the edge 303 of wafer 302, thereby retaining wafer 302 on the wafer handling robot 10, 20, 30 (shown in FIGS. 1–3) with radial clamping forces only at the edge 303 of the wafer 302. No forces are exerted on either upper or lower surfaces of the wafer. The clamping force is sufficient to retain wafer 302 without deforming wafer 302.

In operation, as fluid pressure is provided through conduit 114 to increase the fluid pressure within cylinder bore 130, piston 150 is moved towards wafer 302. As piston 150 moves towards the edge 303 of wafer 302, piston rod 152 also moves towards the edge 303 of wafer 302. As piston rod 152 moves towards the edge 303 of wafer 302, it contacts clamping arm 110 and exerts an actuation force against clamping arm 110. The actuation force against clamping arm 110 causes clamping arm 110 to flex outwardly away from the housing body 102 and towards the edge 303 of wafer 302 at a shoulder 123 proximate the location where the clamping arm 110 extends from the housing body 102. As clamping arm 110 flexes away from housing body 102, it resists the actuation force from the rod 152 and acts as a leaf spring or other biasing member, thereby returning to the neutral or disengaged position when the actuation force is removed as rod 152 is withdrawn away from the clamping arm 110. To release the wafer 302 from engagement by the clamping arm 110 and thereby the clamping finger 111, fluid pressure is vented from cylinder bore 130 through conduit 140 or some other means. As fluid pressure is vented from within cylinder bore 130, the biasing force of clamping arm 110 will continue to act on piston rod 152 and piston 150. Because piston 150 is not actuated by the fluid pressure in cylinder 130 when fluid pressure is removed from cylinder bore 130, the biasing force of clamping arm 110 will act against rod 152 and cause piston rod 152 and piston 150 to move away from the edge 303 of wafer 302 and within the body 102, thereby releasing wafer 302.

It should be noted that the fluid cylinder clamping mechanism 600 shown is initially in a disengaged position at rest when no fluid pressure is provided in the front volume 131. However, it will be obvious to one of ordinary skill in the art to modify fluid cylinder clamping mechanism 600 so that the fluid cylinder clamping mechanism 600 is maintained in an engaged position when no fluid pressure is provided in the front volume 131. Although not shown, such modifications could include providing a spring or other biasing member in front volume 131 to overcome the inward bias of clamping arm 110 and to initially bias piston rod 152 against clamping arm 110. In such a modified embodiment, negative pressure such as provided by a vacuum pressure source in communication with conduit 140 could energize the assembly 120 and disengage the fluid cylinder clamping mechanism 600. Releasing the vacuum pressure would then permit the biasing member within front volume 131 to again engage the clamping finger 111 of clamping arm 110 against wafer 302. The same modifications could permit engagement of the assembly 120 by actuation with positive pressure provided in the back volume 132 of assembly 120. Releasing the positive pressure would thereby permit the spring or other biasing member to overcome the inward bias of clamping arm 110 to engage clamping finger 111 against wafer 302.

Bellows Clamping Embodiment

Figure 14:
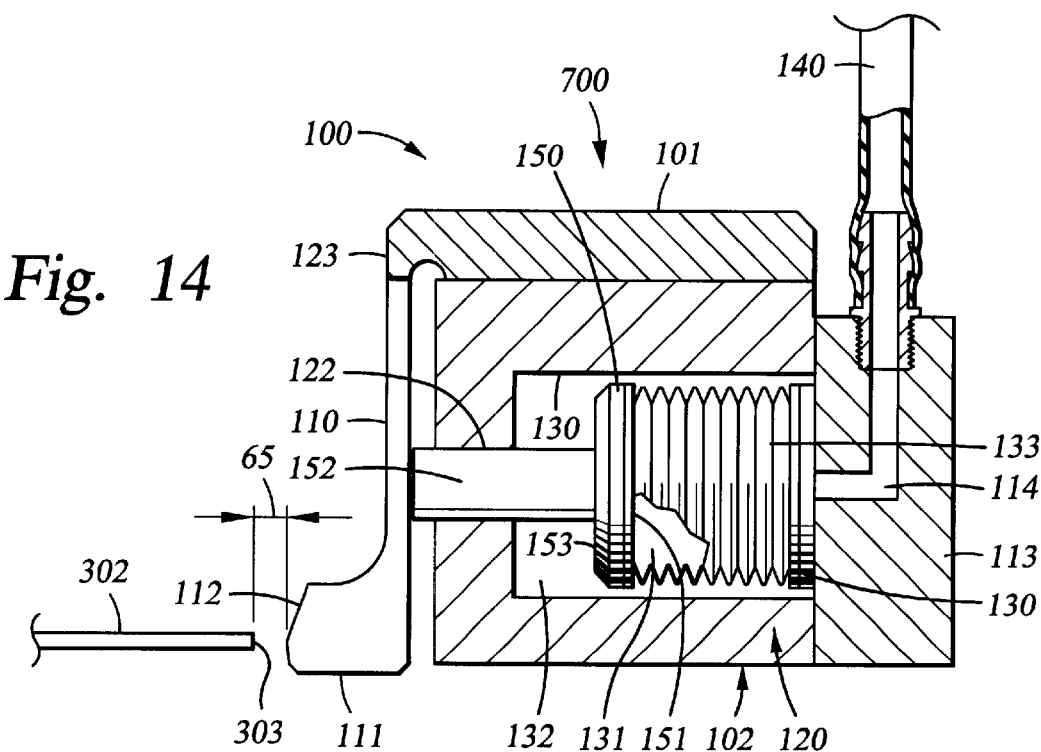
FIG. 14 is a cross-sectional view of a second embodiment of a clamping device in accordance with the present invention shown in a neutral, released position.
Figure 15:
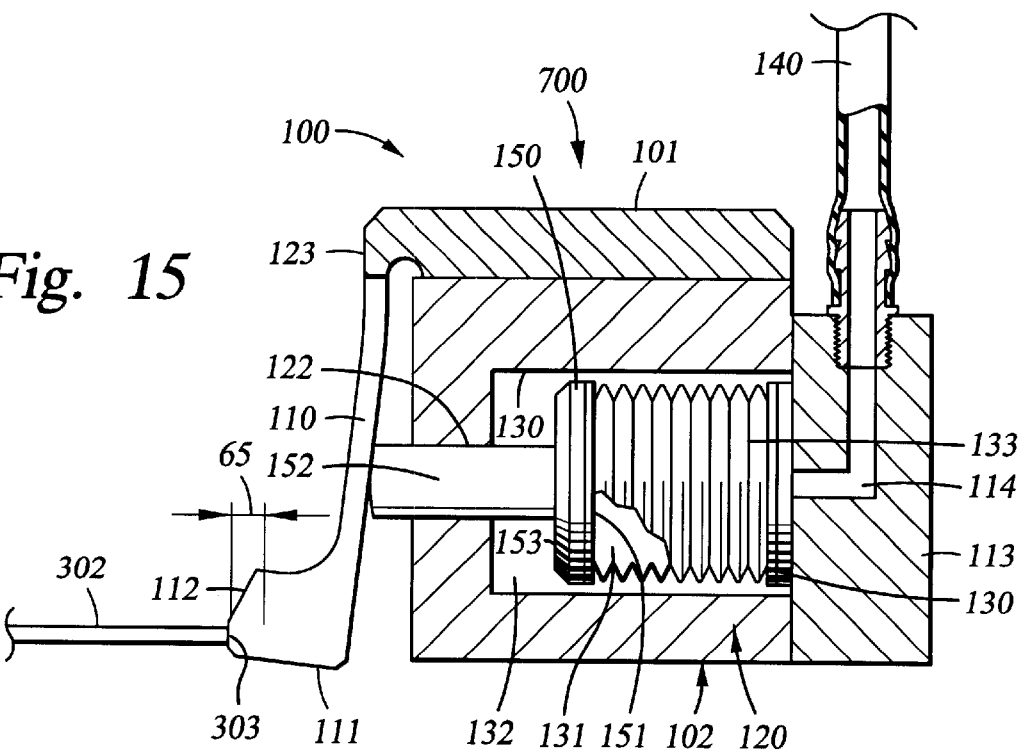
FIG. 15 is a cross-sectional view of a second embodiment of a clamping device in accordance with the present invention shown in an engaged, or retaining position.

Referring to FIGS. 14–15, in accordance with a second embodiment of the invention, the wafer clamping mechanism is preferably a bellows clamping mechanism 700. Bellows clamping mechanism 700 is preferably mounted to the wafer handling robot arm proximate the wafer 302 so that the operating mechanisms are contained within its housing body 102 without the need for complex linkage mechanisms remote from the wafer 302, which would otherwise be exposed to the atmosphere proximate the wafer 302. Accordingly, particle generation may be minimized to limit or prevent contamination of the wafer 302 through actuation of the wafer clamping mechanism.

Bellows clamping mechanism 700 preferably includes an actuation assembly 120 for providing actuating forces in response to an increase in fluid pressure provided to front volume 131 by an external fluid pressure source (not shown). In the bellows clamping embodiment 700, front volume 131 is defined by bellows 133, a front face 151 of piston 150, and front end cap 113 mounted to body 102. Bellows 133 is disposed within the cylinder bore 130 defined by housing body 102. Fluid pressure is increased within bellows 133 through control line 140 and conduit 114 in fluid communication with both the front volume 131 within bellows 133 and the source of fluid pressure (not shown).

Actuation assembly 120 further includes slidable piston 150, slidably disposed within cylinder bore 130. In the bellows clamping embodiment shown in FIGS. 14–15, piston 150 is not adapted to be sealingly engaged about the walls of the body 102, but is instead fixedly and sealingly connected to a distal end of bellows 133 within housing body 102. The opposing end of bellows 133 is fixedly and sealingly attached to the front end cap 113 opposite wafer 302 and clamping arm 110. Bellows 133 are adapted to permit piston 150 to freely reciprocate within cylinder bore 130 in response to a fluid pressure increase in the front volume 131 within bellows 133. Accordingly, as fluid pressure is increased within the front volume 131 of cylinder bore 130, piston 150 is actuated towards the wafer 302.

Actuation assembly 120 further includes a piston rod 152 connected to a back, or rear face 153 of piston 150. The piston rod 152 extends perpendicularly from the back face 153 outward and through an aperture 122 formed in the body 102. In operation, the piston rod 152 translates the movement of piston 150 to actuate clamping arm 110 and is suitably sized to contact clamping arm 110 during actuation of the bellows clamping mechanism 700.

Clamping arm 110 preferably extends outwardly and downwardly from an upper portion of housing body 102 and has a clamping finger 111 at a distal end of the clamping arm 110 for engagement with the wafer 302 when the clamping arm 110 has been actuated by actuation assembly 120. At a proximal end of the clamping arm 110 is attached a semi-rigid biasing shoulder 123, which in a particular embodiment is an integral component of the clamping arm 110. The shoulder 123 is sufficiently flexible to allow a biasing force on the clamping arm 110 to actuate the clamping arm 110 away from the body 102 and sufficiently rigid to allow the clamping arm 110 to return to a neutral position (shown in FIG. 14) when the actuating force is removed. Bellows clamping mechanism 700 is shown in FIG. 14 in a neutral, disengaged position in which clamping arm 110 does not contact the edge 303 of wafer 302. Clamping arm 110 is, accordingly, shown in its neutral, disengaged position in which it is biased generally towards the housing body 102 and away from the wafer 302. A clamping distance 65 is provided between the clamping finger 111 and the edge 303 of the wafer 302 in the disengaged position shown in FIG. 14 whereby the clamping finger 111 does not contact the edge 303 of the wafer 302. In the disengaged position, a wafer 302 may be placed on or removed from the blade 64.

A clamping arm mounting plate 101 mounted to body 102 preferably includes a shoulder 123 from which clamping arm 110 extends downward and slightly away from the body 102 of clamping mechanism 100. Hinge portion 123 may preferably be a flexure member which may yield to permit outward movement of the clamping arm 110 as it is engaged against the edge 303 of wafer 302. Alternatively, hinge portion 123 is rigid and clamping arm 110 is a flexure member which may, itself, flex to permit outward movement of clamping finger 111 provided at a distal end of clamping arm 110 proximate the edge of wafer 302.

FIG. 15 shows bellows clamping mechanism 700 in its engaged position in which clamping finger 111 is engaged with the edge 303 of wafer 302 to retain wafer 302 on the wafer handling robot. Accordingly, clamping arm 110 and clamping finger 111 have closed clamping distance 65 so that clamping finger 111 contacts the edge 303 of wafer 302, thereby retaining wafer 302 on the wafer handling robot 10, 20, 30 (shown in FIGS. 1–3) with radial clamping forces only at the edge 303 of the wafer 302. No forces are exerted on either upper or lower surfaces of the wafer. The clamping force is sufficient to retain wafer 302 without deforming wafer 302.

In operation, as fluid pressure is provided through conduit 114 to increase the fluid pressure within bellows 133, piston 150 is moved towards wafer 302. As piston 150 moves towards the edge 303 of wafer 302, piston rod 152 also moves towards the edge 303 of wafer 302. As piston rod 152 moves towards the edge 303 of wafer 302, it contacts clamping arm 110 and exerts an actuation force against clamping arm 110. The actuation force against clamping arm 110 causes clamping arm 110 to flex outwardly away from the housing body 102 and towards the edge 303 of wafer 302 at a hinge point 123 proximate the location where the clamping arm 110 extends from the housing body 102. As clamping arm 110 flexes away from housing body 102, it resists the actuation force from the rod 152 and acts as a leaf spring or other biasing member, thereby returning to the neutral or disengaged position when the actuation force is removed as rod 152 is withdrawn away from the clamping arm 110. To release the wafer 302 from engagement by the clamping arm 110 and thereby the clamping finger 111, fluid pressure is vented from the front volume 131 within bellows 133 through conduit 140 or through another evacuation member. As fluid pressure is vented from within bellows 133, the biasing force of clamping arm 110 will continue to act on piston rod 152 and piston 150. Because piston 150 is not actuated by the fluid pressure within bellows 133 when fluid pressure is removed from front volume 131, the biasing force of clamping arm 110 will act against rod 152 and cause piston rod 152 and piston 150 to move away from the edge 303 of wafer 302 and within the body 102, thereby releasing wafer 302.

It should be noted that the bellows clamping mechanism 700 shown is initially in a disengaged position at rest when no fluid pressure is provided in the front volume 131. However, it will be obvious to one of ordinary skill in the art to modify bellows clamping mechanism 700 so that the bellows clamping mechanism 700 is maintained in an engaged position when fluid pressure is not increased within the front volume 131. Although not shown, such modifications could include providing a spring or other biasing member in front volume 131 to overcome the inward bias of clamping arm 110 and to initially bias piston rod 152 against clamping arm 110. In such a modified embodiment, negative pressure such as provided by a vacuum pressure source in communication with conduit 140 could energize the assembly 120 and disengage the bellows clamping mechanism 700. Releasing the vacuum pressure would then permit the biasing member within front volume 131 to again engage the clamping finger 111 of clamping arm 110 against wafer 302. The same modifications could permit engagement of the assembly 120 by actuation with positive pressure provided in the back volume 132 of assembly 120. Releasing the positive pressure would thereby permit the spring or other biasing member to overcome the inward bias of clamping arm 110 to engage clamping finger 111 against wafer 302. Similarly, evacuating back volume 132 of cylinder bore 130 with a vacuum pressure source would increase the pressure within front volume 131 relative to back volume 132, thereby causing piston 150 to move outward towards clamping arm 110 to engage wafer 302.

Bladder Clamping Embodiment

Referring to FIGS. 16–17, in accordance with a third embodiment of clamping mechanism 100 of the present invention, the wafer clamping mechanism 100 is preferably a bladder clamping mechanism 800. Bladder clamping mechanism 800 is preferably mounted to the wafer handling robot arm proximate the wafer 302 so that the operating mechanisms are contained within its housing body 102 without the need for complex linkage mechanisms remote from the wafer 302, which would otherwise be exposed to the atmosphere proximate the wafer 302. Accordingly, particle generation may be minimized to minimize or prevent contamination of the wafer through actuation of the wafer clamping mechanism.

Bladder clamping mechanism 800 preferably includes an actuation assembly 120 for providing actuating forces in response to an increase in fluid pressure provided to a front volume 131 within bladder 230 by an external fluid pressure source (not shown). Actuation assembly 120 includes bladder 230, disposed within a chamber 730 defined by body 102. Fluid pressure is increased within front volume 131 of bladder 230 through control line 140, conduit 114 formed in a front end cap 113 of body 102, and conduit 115 formed in body 102, each of which is in fluid communication with both the front volume 131 within bladder 230 and the source of fluid pressure (not shown).

Bladder 230 is adapted to be disposed within chamber 730 and to inflate and deflate within chamber 730 in response to an increased fluid pressure in the front volume 131 defined by bladder 230 through conduit 140. Accordingly, as fluid pressure is increased within the front volume 131 of bladder 230, bladder 230 expands or inflates towards the wafer 302 to actuate clamping arm 110. Clamping arm 110 may include a shoulder or nipple 252 extending from clamping arm 110 in a direction generally towards bladder 230 to assist in contact between the expanding bladder 230 within chamber 730 to actuate clamping arm 110. Shoulder 252 preferably extends from clamping arm. 110 and into chamber 730 provided in housing body 102 of the actuation assembly 120 and is suitably sized to contact bladder 230 during actuation of the bladder clamping mechanism 700.

Clamping arm 110 preferably extends outwardly and downwardly from an upper portion of housing 102 and has a clamping finger 111 at a distal end of the clamping arm 110 for engagement with the wafer 302 when the clamping arm 110 has been actuated by actuation assembly 120. At a proximal end of the clamping arm 110 is attached a semi-rigid biasing shoulder 123, which in a particular embodiment is an integral component of the clamping arm 110. The shoulder 123 is sufficiently flexible to allow a biasing force on the clamping arm 110 to actuate the clamping arm 110 away from the body 102 and sufficiently rigid to allow the clamping arm 110 to return to a neutral position (shown in FIG. 16) when the actuating force is removed. Bladder clamping mechanism 800 is shown in FIG. 16 in a neutral, disengaged position in which clamping arm 110 does not contact the edge 303 of wafer 302. Clamping arm 110 is, accordingly, shown in its neutral, disengaged position in which it is biased generally towards the housing body 102 and away from the wafer 302. A clamping distance 65 is provided between the clamping finger 111 and the edge 303 of the wafer 302 in the disengaged position shown in FIG. 16 whereby the clamping finger 111 does not contact the edge 303 of the wafer 302. In the disengaged position, a wafer 302 may be placed on or removed from the blade 64.

FIG. 17 shows bladder clamping mechanism 800 in its engaged position in which clamping finger 111 is engaged with the edge 303 of wafer 302 to retain wafer 302 on the wafer handling robot. Accordingly, clamping arm 110 and clamping finger 111 have closed clamping distance 65 so that clamping finger 111 contacts the edge 303 of wafer 302, thereby retaining wafer 302 on the wafer handling robot 10, 20, 30 (shown in FIGS. 1–3) with radial clamping forces only at the edge 303 of the wafer 302. No forces are exerted on either upper or lower surfaces of the wafer. The clamping force is sufficient to retain wafer 302 without deforming wafer 302.

In operation of the third embodiment 800, as fluid pressure is increased within front volume 131 within bladder 230, bladder 230 expands or inflates radially towards wafer 302. As bladder 230 expands radially towards clamping arm 110, it contacts clamping arm 110 or shoulder 252 of clamping arm 110. Shoulder 252 translates the radial expansion of bladder 230 to actuate clamping arm 110 and is suitably sized to contact clamping arm 110 during actuation of the bladder clamping mechanism 800. The actuation force against clamping arm 110 causes clamping arm 110 to move outwardly away from the housing body 102 and towards the edge 303 of wafer 302. As clamping arm 110 moves away from housing 102, it resists the actuation force from the bladder 230 and acts as a leaf spring or other biasing member, thereby returning to the neutral or disengaged position when the actuation force is removed as bladder 230 is deflated and moved away from the clamping arm 110. To release the wafer 302 from engagement by the clamping arm 110 and thereby the clamping finger 111, fluid pressure is vented or otherwise decreased within the front volume 131 within bladder 230. As fluid pressure is decreased within front volume 131 within bladder 230, the biasing force of clamping arm 110 may continue to act on bladder 230. Because bladder 230 is not actuated when fluid pressure is removed from bladder 230, the biasing force of clamping arm 110 may act against bladder 230 to compress bladder 230 or assist in the deflation of bladder 230 within chamber 730. Accordingly, clamping arm 110 and clamping finger 111 retracts from wafer 302, thereby releasing wafer 302 and disengaging clamping mechanism 100.

Dual Bellows Leaf Spring Embodiment

Referring now to FIGS. 18–21, in accordance with a fourth embodiment of the invention, the wafer clamping mechanism is preferably a dual bellows leaf spring clamping mechanism 900. Dual bellows leaf spring clamping mechanism 900 is preferably mounted to the wafer handling robot arm proximate the wafer 302 so that the operating mechanisms are contained within a manifold 902 and bellows 930, 940 without the need for complex linkage mechanisms remote from the wafer 302, which would otherwise be exposed to the atmosphere proximate the wafer 302. Accordingly, particle generation may be minimized to minimize or prevent contamination of the wafer 302 through actuation of the wafer clamping mechanism.

Dual bellows leaf spring clamping mechanism 900 preferably includes an actuation assembly 920 for providing actuating forces in response to fluid pressure provided to manifold 902 and thence to bellows 930, 940 by an external fluid pressure source (not shown). Actuation assembly 920 includes a first bellows 930 and a second bellows 940 sealingly engaged on opposing sides of manifold 902. First and second bellows 930, 940 each define bellows chambers 931, 932 (Shown in FIGS. 19 and 21), respectively, in fluid communication with a passageway 905 defined within the manifold 902 of actuation assembly 920, which is described in further detail below.

Actuation assembly 920 further includes a first bellows actuation member 950 connected to a distal end of first bellows 930 and a second bellows actuation plate 960 connected to a distal end of second bellows 940. Proximal ends of bellows 930, 940 are fixedly and sealingly attached to opposing walls of manifold 902. Bellows 930, 940 preferably extend in opposite directions in a plane co-extensive with wafer 302. Bellows 930, 940 are adapted to permit bellows actuation plates 950, 960 to freely reciprocate in response to fluid pressure within the chambers 931, 932 of bellows 930, 940, respectively.

Figure 18:
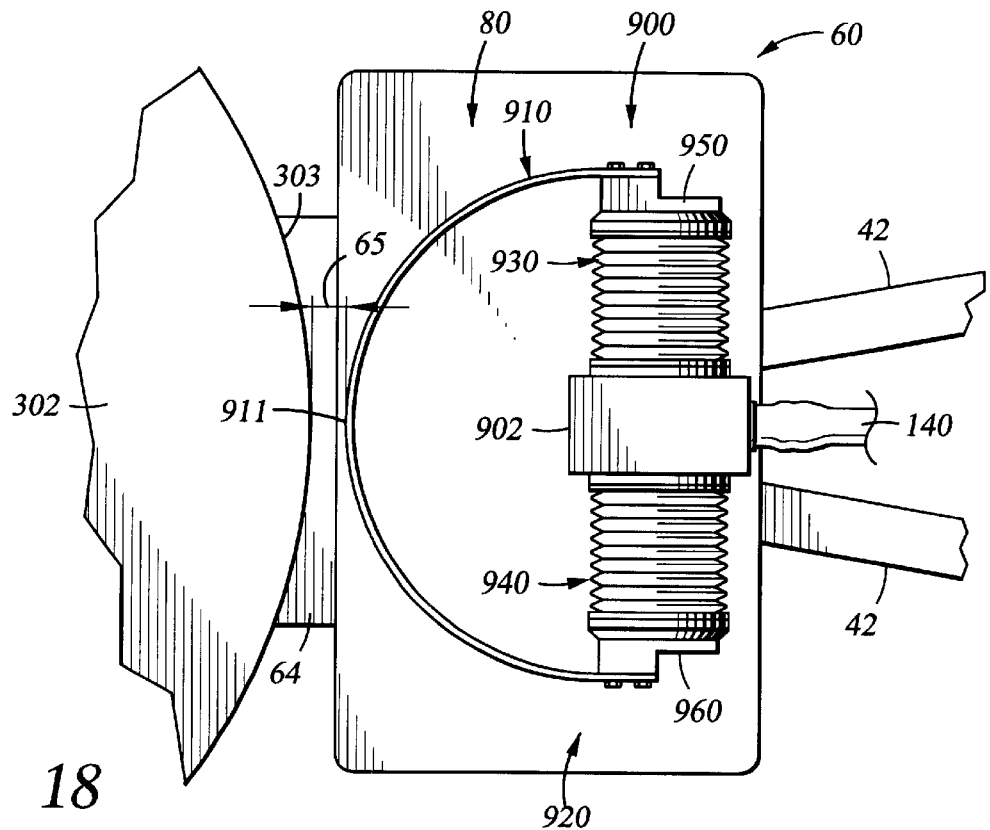
FIG. 18 is a partial top view of a workpiece handling member shown in the extended, disengaged position in connection with the "frog-leg type" robot of FIG. 1.
Figure 19:
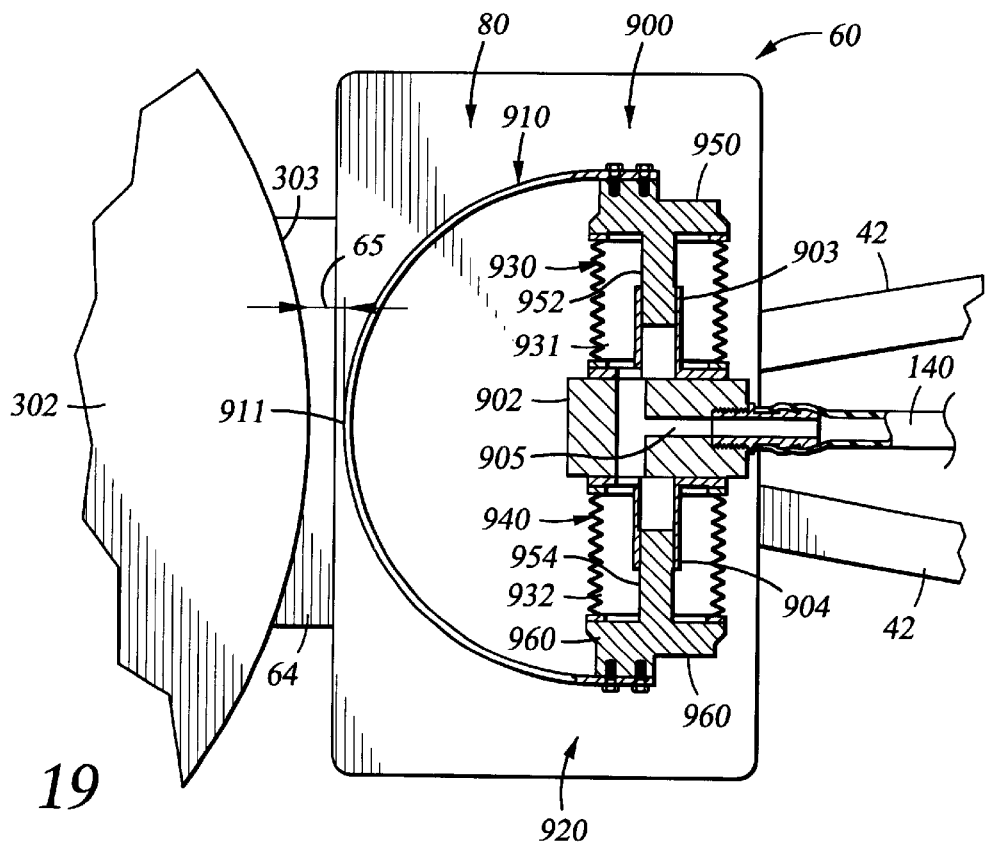
FIG. 19 is a partial top view of a workpiece handling member shown in the extended, disengaged position in connection with the "frog-leg type" robot of FIG. 18 and also showing a cross-sectional view of a primary, vacuum pressure embodiment of the dual bellows leaf spring clamping mechanism in the disengaged position.
Figure 20:
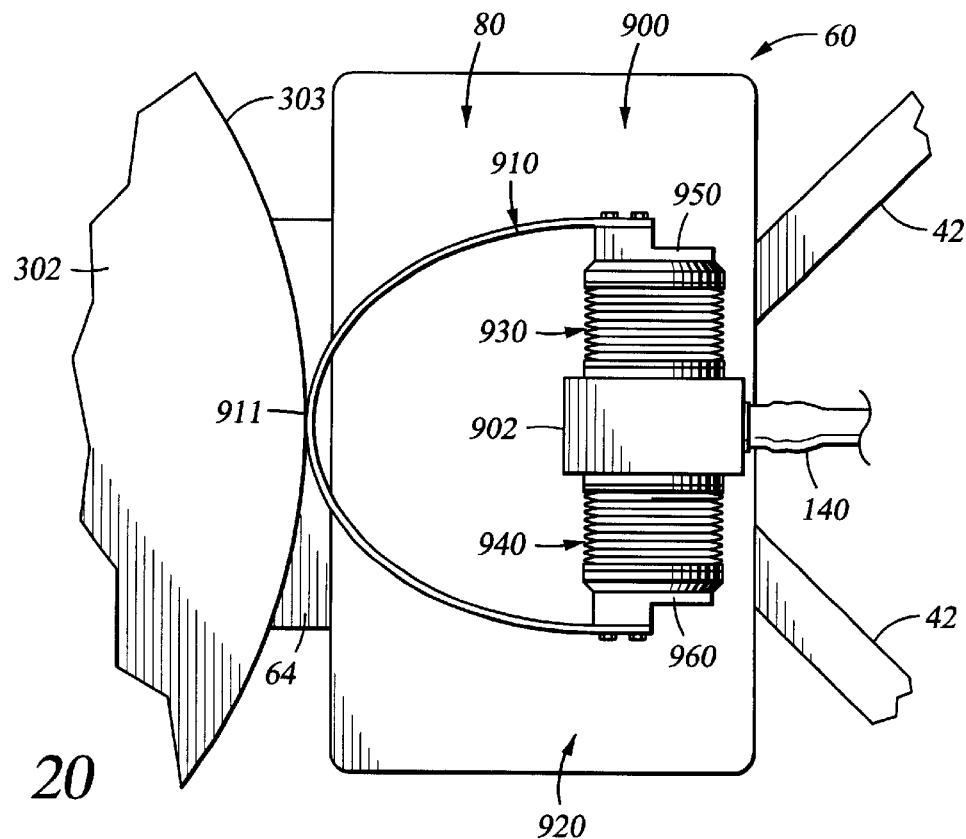
FIG. 20 is a partial top view of a workpiece handling member of FIG. 22 shown in the retracted, engaged position in connection with the "frog-leg type" robot of FIG. 18.
Figure 21:
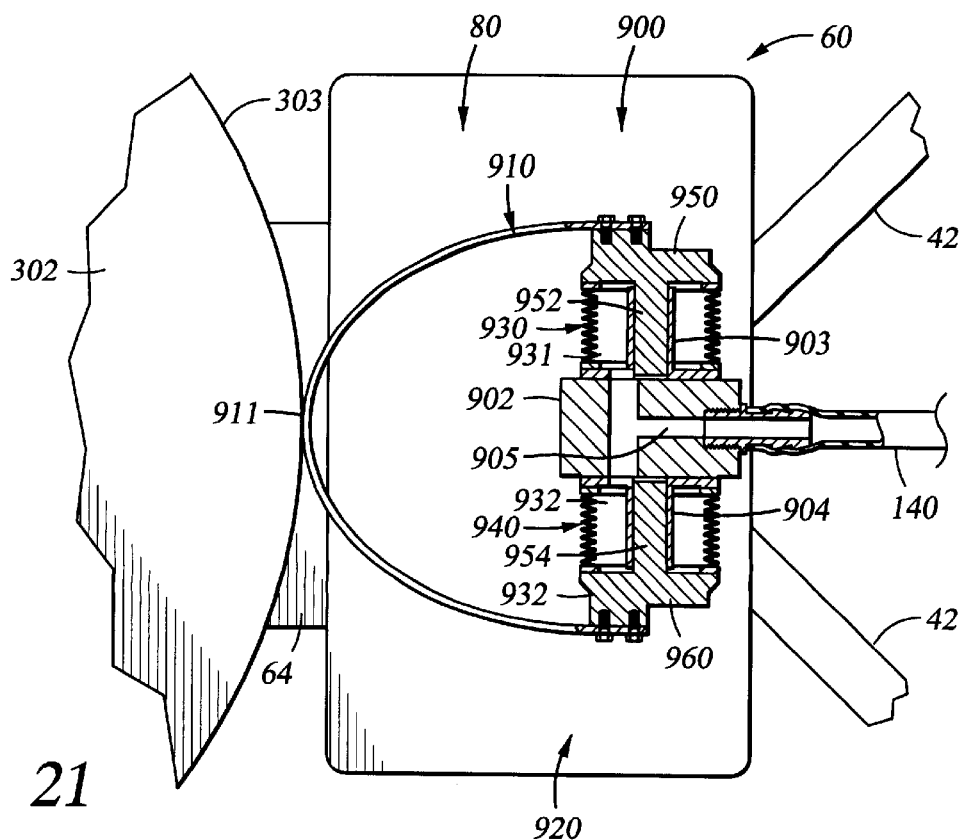
FIG. 21 is a partial top view of a workpiece handling member shown in the retracted, engaged position in connection with the "frog-leg type" robot of FIG. 18 and also showing a cross-sectional view of a primary, vacuum pressure embodiment of the dual bellows leaf spring clamping mechanism in the engaged position.

Opposing ends of a flexure member such as leaf spring 910, which may be stainless steel, are fixedly attached to both bellows actuation plates 950, 960, and are flexed in an arc between the actuation plates 950, 960 on a side of the manifold 902 generally towards the wafer 302. Accordingly, the leaf spring 910 is held in place in a plane co-extensive with the wafer 302. As shown in FIGS. 18 and 19, leaf spring 910 is normally biased outwardly away from the manifold 902 so that apogee portion 911 is normally retracted generally away from the wafer 302. Accordingly, as leaf spring 910 attempts to straighten according to its normal bias, bellows 930, 940 are extended from the manifold 902 in opposing directions. As shown in FIGS. 20 and 21, as bellows 930, 940 are retracted towards manifold 902, leaf spring 910 is further bent away from its normal bias and apogee portion 911 of leaf spring 910 moves towards wafer 302 to retain wafer 302 on the wafer handling robot. A clamping distance 65 is provided between the leaf spring 910 and the wafer 302 when the leaf spring 910 is in its neutral, retracted, position as shown in FIGS. 18 and 19.

FIG. 18 shows a partial top view of workpiece handling member 60 shown in connection with the "frog-leg type" robot having a single wafer handling blade 64. The robot 10 and robot arms 42 are shown in the extended position for delivery or receipt of a wafer 302. Spring clamping mechanism 900 is shown mounted on clamp wrist 80 in a disengaged position, thus allowing wafer 302 to rest freely on wafer blade 64 for removal therefrom or placement of a wafer 302 thereon. Although not shown, it will be obvious to one of ordinary skill in the art that wafer clamping mechanism 900 may be similarly mounted to the dual-blade robot.

FIG. 20 shows a partial top view of workpiece handling member 60 shown in connection with the "frog-leg type" robot having a single wafer handling blade 64. The robot arms 42 are shown in the retracted position for rotation of the robot 10. Wafer clamping mechanism 900 is shown mounted on clamp wrist 80 in an engaged position, thus securing the wafer 302 against retaining member 70 (shown in FIG. 1). Although not shown, it will be obvious to one of ordinary skill in the art that wafer clamping mechanism 900 may be similarly mounted to the dual-blade robot.

FIGS. 19 and 21 show a detailed partial cut-away view of workpiece handling member 60 in the disengaged position of FIG. 18 and the engaged position of FIG. 20, respectively. FIGS. 19 and 21 show wrist housing 80, which is operatively connected to robot arms 42. Bellows 930, 940 define and enclose bellows chambers 931, 932. Manifold 902 includes a fluid passageway 905 which communicates fluid pressure provided through conduit 140 to both of the bellows chambers 931, 932 of bellows 930, 940, respectively.

Within bellows chambers 931 and extending in opposing directions generally outward away from manifold 902 are first and second cylinders 903, 904. Cylinders 903, 904 are adapted to receive actuation plate extensions 952, 954, extending generally inward toward manifold 902 from actuation plates 950, 960, respectively. Cylinders 903, 904 and extensions 952, 954 provide a telescoping support mechanism to assist in maintaining generally axial movement of actuation plates 950, 960 away from manifold 902 as actuation plates 950, 960 reciprocate to retract and extend bellows 930, 940, thereby respectively engaging spring 910 with and disengaging spring 910 from wafer 302. In the primary embodiment 900 shown in FIGS. 19 and 21, bellows 930, 940 are initially at a resting, disengaged position when spring clamping mechanism 900 is not energized. However, in an alternative embodiment 980 described below with reference to FIGS. 22 and 23, the resting position may engage the clamping mechanism and the wafer is, instead, disengaged by energizing the spring clamping mechanism.

FIGS. 19 and 21 respectively show a partial cut-away view of the spring clamping mechanism 900 in the initial, resting position of FIG. 18 in which the mechanism is disengaged and in the engaged position of FIG. 20. With reference to FIG. 19, bellows 930, 940 are expanded by the biasing force of spring 910 and the spring 910 is withdrawn from the edge 303 of wafer 302. Bellows 930, 940 are retracted to urge spring 910 against the edge 303 of wafer 302 by decreasing the fluid pressure within bellows chambers 931, 932. A vacuum pressure source is provided in communication with conduit 140 and passageway 905 to at least partially evacuate the volume within bellows chambers 931 and 932. As the bellows chambers 931, 932 are evacuated, bellows 930, 940 and actuation plates 950, 960 are retracted to further flex spring 910, which urges the apogee portion 911 of spring 910 against the edge 303 of wafer 302 as shown in FIG. 21. As spring 910 is urged against wafer 302, wafer 302 is urged against retaining member 70 provided at the distal end of wafer blade 64 (shown in FIGS. 1).

Figure 22:
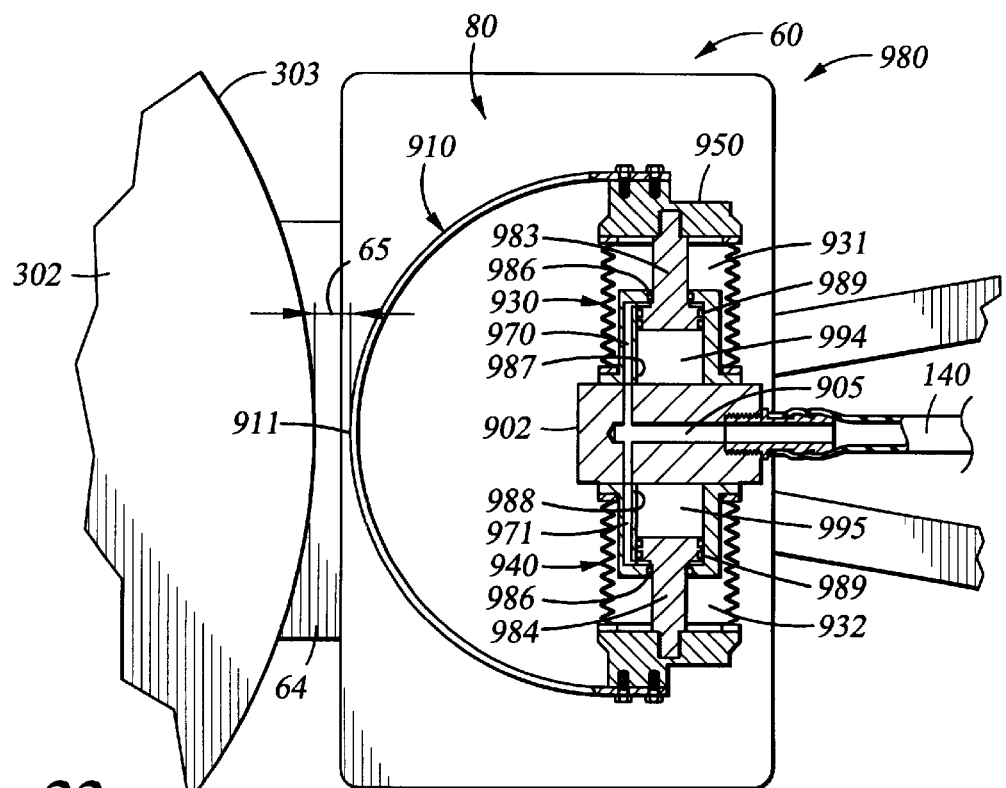
FIG. 22 is a partial top view of a workpiece handling member shown in the extended, disengaged position in connection with the "frog-leg type" robot of FIG. 18 and also showing a cross-sectional view of a secondary, positive pressure embodiment of the dual bellows leaf spring clamping mechanism in the disengaged position.
Figure 23:
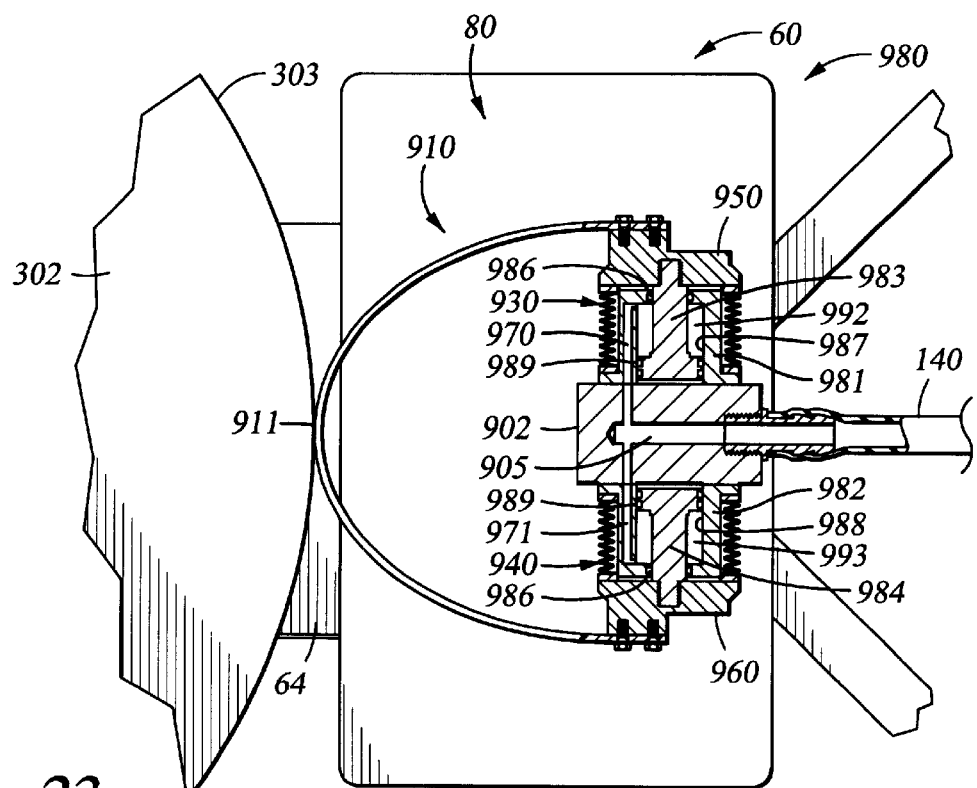
FIG. 23 is a partial top view of a workpiece handling member shown in the retracted, engaged position in connection with the "frog-leg type" robot of FIG. 18 and also showing a cross-sectional of a secondary, positive pressure embodiment of the dual bellows leaf spring clamping mechanism in the engaged position.

FIGS. 22 and 23 show partial cut-away views of an alternative embodiment of spring clamping mechanism 980 in the disengaged and engaged positions, respectively. The secondary embodiment 980 is energized using a positive fluid pressure source (not shown) instead of the vacuum source used in the primary embodiment 900 to energize the clamping mechanism. Like the primary embodiment 900, secondary embodiment 980 is at rest initially in the disengaged position shown in FIG. 22 with spring 910 retracted away from the wafer 302. As shown in FIG. 23, when energized by the fluid pressure source, the mechanism 980 is engaged to urge the spring 910 against wafer 302. A cylinder 981, 982 is provided within each of bellows chambers 931, 932 and is sealingly mounted to manifold 902. Cylinders 981, 982 receive pistons 983, 984 extending from actuation plate extension 950, 960 and include sealing members 986 to permit the piston to reciprocate within cylinders 981, 982 while providing sealing engagement between bellows chambers 931, 932 and cylinder bores 987, 988 defined by inner walls of cylinder 981, 982. Passageways 970, 971 are provided in cylinders 981, 982 to provide fluid communication between manifold passageway 905 and cylinder bores 987, 988.

Pistons 983, 984 each include a sealing member 989 around the periphery thereof to define a first volume 992, 993 between the sealing member 989, the cylinder bore 987, 988, and the sealing member 986. Second volume 994, 995 is similarly defined between the sealing member 986, the cylinder bore 987, 988, and manifold 902. Passageways 970, 971 provide fluid communication between the first volume 992, 993 and passageway 905 of manifold 902 so that fluid pressure provided through conduit 140 is communicated to first volume 992, 993.

Engagement and disengagement of wafer 302 by spring 910 and the corresponding outward and inward movements of actuation plates 950, 960 are similar to the primary embodiment 900. The operational difference between the two embodiments is in the manner of energizing the mechanism. In the alternative embodiment 980, positive fluid pressure is provided through conduit 140, manifold passageway 905, and cylinder passageways 970, 971 to the first volume 992, 993 within each of the bellows 930, 940, respectively. An increase in fluid pressure within first volumes 992, 993 causes pistons 983, 984 and actuation plates 950, 960 attached thereto to reciprocate inward toward manifold 902. Accordingly as described above in connection with the primary embodiment 900, spring 910 is flexed to urge apogee portion 911 outward to engage wafer 302. Removing the pressure source from conduit 140 decreases the pressure in first volume 992, 993. The biasing force from spring 910 again returns pistons 983, 984 to an outward position, and apogee portion 911 of spring 910 withdraws away from wafer 302 to release wafer 302 from engagement within the clamping mechanism 980.

While the foregoing is directed to preferred embodiments of the present invention, other and further embodiments of the invention may be devised without departing from the basic scope thereof. The scope of the invention is determined by the claims which follow.

What is claimed is:

1. A mechanism for retaining a wafer, comprising:
   a robot blade having a base and a wafer supporting surface;
   a fluid actuation assembly mounted to the base proximate the wafer supporting surface, the fluid actuation assembly having a housing, a fluid cylinder within the housing, a clamping member comprising a clamping arm affixed to the housing and normally biased generally toward the housing; and
   a piston disposed within the fluid cylinder and a piston rod affixed to and extending from the piston and in mating abutment with the clamping arm.

2. A mechanism for retaining a wafer, comprising:
   a robot blade having a base and a wafer supporting surface;
   a means for actuation mounted to the base proximate the wafer supporting surface;
   a housing defining a chamber; and
   a means for clamping the wafer affixed to the housing and engagable with the means for actuation, wherein the means for clamping comprises a clamping arm affixed to the housing and a clamping finger disposed at a distal end of the clamping arm, and the means for actuation comprises a piston disposed within the chamber and a piston rod affixed to and extending from the piston and in mating abutment with the clamping arm.

3. The mechanism of claim 2, further comprising:
   a fluid source connected to the means for actuation.

4. An apparatus for supporting and retaining a wafer, comprising:
   a blade defining a wafer supporting surface and having a base;
   a fluid operated actuator disposed on the base and having at least one clamping member connected to the actuator; and
   a fluid source connected to the actuator, the clamping member comprising at least one clamping arm having a wafer contacting member disposed on a portion thereof, the actuator comprising a drive member which contacts the at least one clamping member under fluid actuation, and wherein the clamping arm is connected to the actuator and flexibly extends therefrom.

5. The apparatus of claim 4, wherein the actuator is selected from the group consisting of fluid cylinders, bladder type actuators, and bellows type actuators.

6. The apparatus of claim 5, wherein the actuator is pneumatically driven.

7. The apparatus of claim 5, wherein the actuator is hydraulically driven.

* * * * *